United States Patent
Park et al.

(10) Patent No.: US 11,429,215 B2
(45) Date of Patent: Aug. 30, 2022

(54) ELECTROLUMINESCENT DISPLAY DEVICE

(71) Applicant: LG Display Co., Ltd., Seoul (KR)

(72) Inventors: Heon-Kwang Park, Paju-si (KR);
Soon-Kwang Hong, Paju-si (KR);
Mardin Kwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/130,822

(22) Filed: Dec. 22, 2020

(65) Prior Publication Data

US 2021/0200361 A1 Jul. 1, 2021

(30) Foreign Application Priority Data

Dec. 26, 2019 (KR) .......................... 10-2019-0174973

(51) Int. Cl.
*G06F 3/041* (2006.01)
*H01L 51/52* (2006.01)
*H01L 27/32* (2006.01)

(52) U.S. Cl.
CPC .......... *G06F 3/0412* (2013.01); *H01L 27/323* (2013.01); *H01L 27/3276* (2013.01); *H01L 51/5253* (2013.01)

(58) Field of Classification Search
CPC . G06F 3/0412; H01L 27/323; H01L 51/5253; H01L 27/3276
USPC .................................................. 345/170–178
See application file for complete search history.

(56) References Cited

U.S. PATENT DOCUMENTS

| | | | | |
|---|---|---|---|---|
| 2016/0307971 A1* | 10/2016 | Jeon | ...................... | G09G 3/3233 |
| 2018/0158741 A1* | 6/2018 | Kim | ........................ | H01L 22/32 |
| 2018/0158894 A1* | 6/2018 | Park | .................... | H01L 51/5256 |
| 2020/0091459 A1* | 3/2020 | Senoo | ................. | H01L 27/3258 |
| 2020/0152707 A1* | 5/2020 | Won | ....................... | G06F 3/0443 |
| 2020/0174526 A1* | 6/2020 | Jeong | ..................... | G09F 9/301 |
| 2020/0185641 A1* | 6/2020 | Jeong | ................. | H01L 51/0097 |
| 2020/0194516 A1* | 6/2020 | Kim | .................... | H04M 1/0266 |
| 2020/0220098 A1* | 7/2020 | Tsai | .................... | H01L 27/3258 |
| 2020/0411598 A1* | 12/2020 | Gwon | ................. | G06F 3/04164 |
| 2021/0091144 A1* | 3/2021 | Won | ....................... | G06F 3/0446 |
| 2021/0183987 A1* | 6/2021 | Lee | ....................... | H01L 27/3223 |
| 2021/0200361 A1* | 7/2021 | Park | .................... | H01L 51/5253 |
| 2021/0200381 A1* | 7/2021 | Kang | ........................ | B32B 7/12 |
| 2021/0202668 A1* | 7/2021 | Kwon | ................. | H01L 27/3258 |

FOREIGN PATENT DOCUMENTS

| KR | 10-2014-0061897 A | 5/2014 |
|---|---|---|
| KR | 10-2016-0080289 A | 7/2016 |

\* cited by examiner

*Primary Examiner* — Xuemei Zheng
(74) *Attorney, Agent, or Firm* — Seed IP Law Group LLP

(57) ABSTRACT

An electroluminescent display device is provided. The device includes a substrate on which a display area displaying an image and a non-display area surrounding the display area are defined. The device includes a thin film transistor and a light-emitting diode disposed in the display area on the substrate and electrically connected to each other. The device further includes an encapsulation part covering the thin film transistor and the light-emitting diode, a touch sensor part on the encapsulation part, and first and second crack stoppers disposed in the non-display area on the substrate. The second crack stopper is disposed between the first crack stopper and the display area. The first crack stopper includes a first pattern that is formed through a same process as an electrode layer of the touch sensor part.

18 Claims, 9 Drawing Sheets

ELECTROLUMINESCENT DISPLAY DEVICE

CROSS-REFERENCE TO RELATED APPLICATION

The present application claims priority from and the benefit under 35 U.S.C. § 119(a) of Republic of Korea Patent Application No. 10-2019-0174973 filed on Dec. 26, 2019, which is hereby incorporated by reference in its entirety.

BACKGROUND

Technical Field

The present disclosure relates to an electroluminescent display device, and more particularly, to an electroluminescent display device having the improved reliability.

Description of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

The electroluminescent display device includes a driving element and a light-emitting element formed by stacking a plurality of inorganic layers, organic layers and metal layers.

Among these, a light-emitting layer of the light-emitting element is very vulnerable to moisture, and if the light-emitting layer is exposed to the moisture, the performance of the light-emitting element is lowered. Accordingly, the light-emitting element is covered with an encapsulation member, thereby preventing the moisture from permeating the light-emitting layer and protecting the light-emitting element from the external impacts.

BRIEF SUMMARY

Various measures have been attempted in the related art to prevent the moisture from permeating into the light-emitting layer. The inventors of the present disclosure have realized that an inorganic layer is vulnerable to having a crack when external impact or internal stress is applied. When an external impact or internal stress is applied, the crack easily spreads through the inorganic layer, and the crack serves as a path for permeation of moistures. The moisture permeating through the crack can degrade the light-emitting layer, and the reliability of the light-emitting element can be reduced. Having recognized these problems, the inventors of the present disclosure provided an electroluminescent display device that substantially obviates one or more of the problems due to limitations and disadvantages of the related art including the above identified problem of the related art.

One or more embodiments of the present disclosure provides an electroluminescent display device that can improve the reliability by preventing permeation of the moisture.

Additional features and advantages of the present disclosure will be set forth in the description which follows, and in part will be apparent from the description, or can be learned by practice of the present disclosure. The technical benefits and other advantages of the present disclosure will be realized and attained by the structure particularly pointed out in the written description and claims hereof as well as the appended drawings.

To achieve these and other advantages of the present disclosure, as embodied and broadly described herein, there is provided an electroluminescent display device that includes a substrate on which a display area displaying an image and a non-display area surrounding the display area are defined; a thin film transistor and a light-emitting diode disposed in the display area on the substrate and electrically connected to each other; an encapsulation part covering the thin film transistor and the light-emitting diode; a touch sensor part on the encapsulation part; and first and second crack stoppers disposed in the non-display area on the substrate, wherein the second crack stopper is disposed between the first crack stopper and the display area, and wherein the first crack stopper includes a first pattern that is formed through a same process as an electrode layer of the touch sensor part.

It is to be understood that both the foregoing general description and the following detailed description are by example and explanatory and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure. In the drawings.

DETAILED DESCRIPTION

Reference will now be made in detail to embodiments of the disclosure, examples of which are illustrated in the accompanying drawings.

Figure 1:
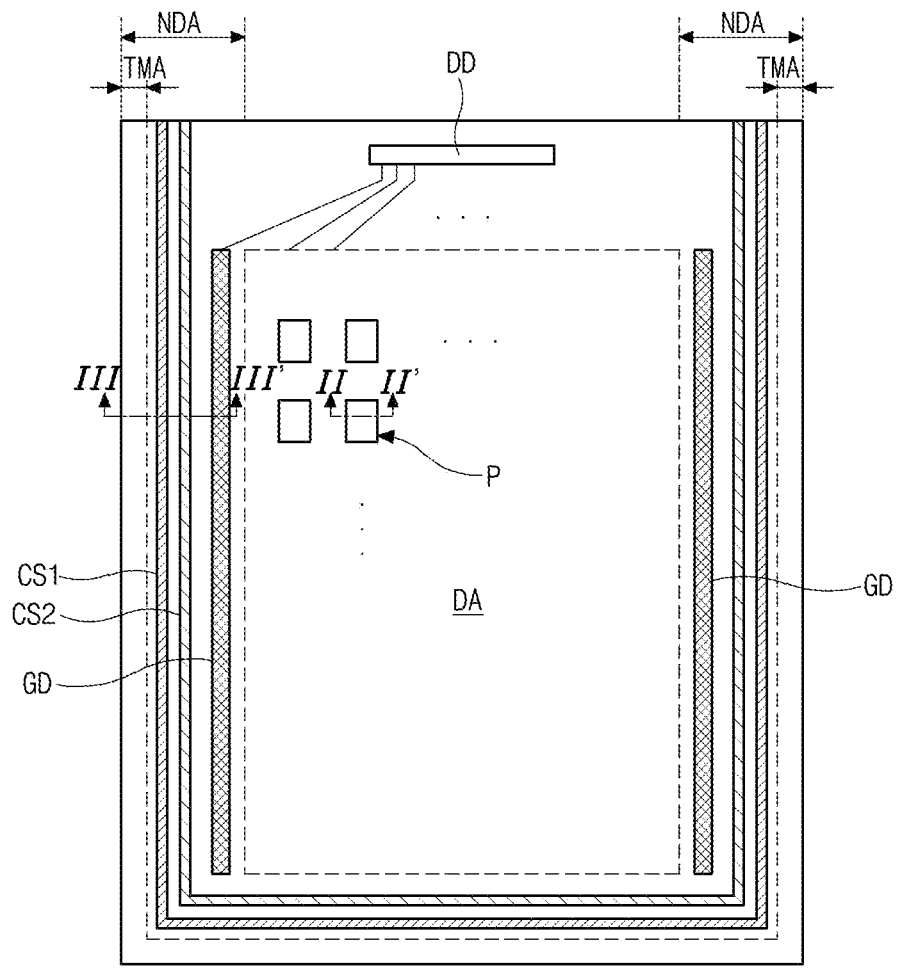
FIG. 1 is a schematic plan view of an electroluminescent display device according to an embodiment of the present disclosure.

FIG. 1 is a schematic plan view of an electroluminescent display device according to an embodiment of the present disclosure.

In FIG. 1, the electroluminescent display device according to the embodiment of the present disclosure includes a display area DA for displaying an image and a non-display area NDA adjacent to the display area DA.

A plurality of pixels P are disposed in a matrix shape in the display area DA, and each pixel P is supplied with signals through a gate line (not shown), a data line (not shown) and a power supply line (not shown).

Here, each pixel P of the display area DA is shown to have a rectangular shape, but is not limited thereto. For example, each pixel P can have various shapes such as a triangular shape, a hexagonal shape, a rectangular shape with rounded corners, a circular shape, an oval shape, or the like. In addition, adjacent pixels P can have the same shape or have different shapes.

Each pixel P includes at least one thin film transistor and a light-emitting diode, and a specific configuration of the pixel P will described in detail later.

Further, the display area DA is illustrated to have a rectangular shape, but is not limited thereto. For example, the display area DA can have various shapes such as a pentagonal shape, a hexagonal shape, a circular shape, an oval shape, or the like.

A gate driving part GD and a data driving part DD, which generate signals or receive signals from an external driving printed circuit board (PCB) and apply the signals to each pixel P of the display area DA, are provided in the non-display area NDA.

More particularly, the gate driving part GD is disposed in the non-display area NDA at left and right sides of the display area DA, and the data driving part DD is disposed in the non-display area NDA at an upper side of the display area DA. However, the present disclosure is not limited thereto. For example, the data driving part DD can be disposed in the non-display area NDA at a lower side of the display area DA, and the gate driving part GD can be disposed only in the non-display area NDA at the left or right side of the display area DA.

The gate driving part GD includes a plurality of switching elements and signal lines and can be formed on a substrate together with components of the display area DA as a gate-in-panel (GIP) type. The gate driving part GD can be connected to the data driving part DD and can receive signals from the data driving part DD. In addition, the data driving part DD can be attached to the substrate in the form of an integrated circuit (IC), and a pad portion and a link portion for connection with the data driving part DD can be provided in the non-display area NDA at the upper side of the display area DA. However, the configuration of the gate driving part GD and the data driving part DD is not limited thereto and can be changed.

Further, the non-display area NDA has a trimming margin area TMA at an edge thereof. No layer or pattern is formed in the trimming margin area TMA.

Recently, the electroluminescent display device is applied to various devices and can have various shapes according to its use and purpose. The electroluminescent display device is manufactured to have a desired shape by forming a plurality of elements on a mother glass and cutting and trimming the mother glass using a laser. In some embodiments, during the laser trimming, an alignment error between the laser and the mother glass may occur, and thus an undesired portion may be cut off, thereby causing a trimming error. In the present disclosure, to prevent the trimming error, the trimming margin area TMA is provided at the edge of the non-display area NDA.

In some embodiments, the trimming margin area TMA can be formed to surround three sides of the display area DA. That is, the trimming margin area TMA can be formed at other sides except for the upper side of the display area DA where the data driving part DD is disposed. Accordingly, the trimming margin area TMA can surround the left side, the right side and the lower side of the display area DA. However, the present disclosure is not limited thereto, and the trimming margin area TMA can also be formed at the upper side of the display area DA.

Meanwhile, first and second crack stopper CS1 and CS2 are formed in the non-display area NDA. The first and second crack stopper CS1 and CS2 may also be referred as first and second crack prevention parts, respectively. The first and second crack stopper CS1 and CS2 is disposed between the trimming margin area TMA and the gate driving part GD. Accordingly, the gate driving part GD is disposed between the first and second crack stopper CS1 and CS2 and the display area DA. More particularly, the second crack stopper CS2 is disposed between the first crack stopper CS1 and the gate driving part GD, and the gate driving part GD is disposed between the second crack stopper CS2 and the display area DA.

Each of the first and second crack stoppers CS1 and CS2 can be formed to surround the three sides of the display area DA, that is, the left side, the right side and the lower side of the display area DA. In some embodiments, each of the first and second crack stoppers CS1 and CS2 can be continuously extended along the left side, the lower side and the right side of the display area DA. Alternatively, each of the first and second crack stoppers CS1 and CS2 can have at least one broken portion along an extension direction, and the broken portion of the first crack stopper CS1 can be dislocated from the broken portion of the second crack stopper CS2.

Each of the first and second crack stoppers CS1 and CS2 can include at least one conductive pattern, and this will be described in detail later.

As described above, in the electroluminescent display device according to the embodiment of the present disclosure, the first and second crack stoppers CS1 and CS2 are formed in the non-display device NDA, so that the first and second crack stoppers CS1 and CS2 can block the crack from spreading even if the crack is generated due to the impacts from the outside of the display device or the stress inside the display device. Accordingly, the moisture can be prevented from permeating through the crack, thereby protecting the light-emitting layer and improving the reliability of the light-emitting diode.

The configuration of the display area of the electroluminescent display device according to the embodiment of the present disclosure will be described in detail with reference to FIG. 2.

Figure 2:
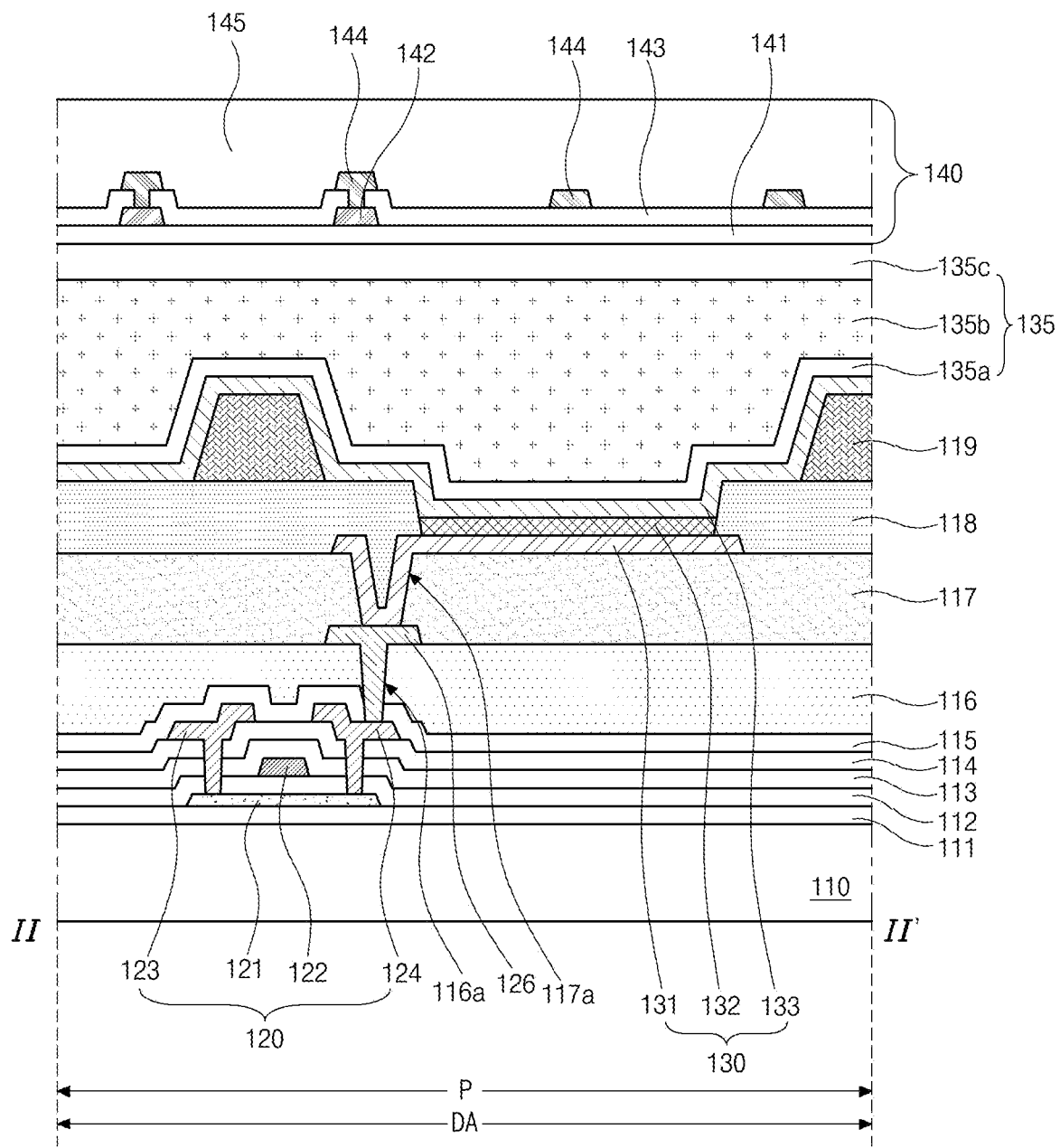
FIG. 2 is a cross-sectional view schematically illustrating a display area of an electroluminescent display device according to the embodiment of the present disclosure.

FIG. 2 is a cross-sectional view schematically illustrating a display area of an electroluminescent display device according to the embodiment of the present disclosure and shows a cross-section of a pixel corresponding to the line II-II' of FIG. 1.

In FIG. 2, the electroluminescent display device includes a thin film transistor 120, a light-emitting diode 130 and a touch sensor part 140 in each pixel P of the display area DA.

The thin film transistor 120 can include a semiconductor layer 121, a gate electrode 122, a source electrode 123, and a drain electrode. In addition, the light-emitting diode 130 can include a first electrode 131, a light-emitting layer 132 and a second electrode 133. Further, the touch sensor part 140 can include a bridge 142 and a sensor electrode 144.

More particular, a buffer layer 111 of an insulating material is formed on substantially an entire surface of a substrate 110 on which the display area DA and the non-display area NDA are defined. The substrate 110 can be a glass substrate or a plastic substrate. For example, polyimide (PI) or polycarbonate (PC) can be used for the plastic substrate, but is not limited thereto.

The buffer layer 111 is a first inorganic layer. The buffer layer 111 can be formed of an inorganic material such as silicon oxide ($SiO_2$) or silicon nitride (SiNx) and can have a single-layered structure. Alternatively, the buffer layer 111 can have a multiple-layered structure, and different materials can be alternately stacked.

A semiconductor layer 121 is patterned and formed on the buffer layer 111. The semiconductor layer 121 can be formed of an oxide semiconductor material, and in this case, a light-shielding pattern (not shown) can be further formed under the semiconductor layer 121. The light-shielding pattern can block light incident on the semiconductor layer 121 and can prevent the semiconductor layer 121 from deteriorating due to the light. Alternatively, the semiconductor layer 121 can be formed of polycrystalline silicon, and both ends of the semiconductor layer 121 can be doped with impurities.

A gate insulation layer 112 of an insulating material is formed on the semiconductor layer 121 substantially over the entire surface of the substrate 110. The gate insulation layer 112 is a second inorganic layer and can be formed of an inorganic insulating material such as silicon oxide ($SiO_2$) or silicon nitride (SiNx). When the semiconductor layer 121 is made of an oxide semiconductor material, the gate insulation layer 112 can be formed of silicon oxide ($SiO_2$). Alternatively, when the semiconductor layer 121 is made of polycrystalline silicon, the gate insulation layer 112 can be formed of silicon oxide ($SiO_2$) or silicon nitride (SiNx).

A gate electrode 122 of a conductive material such as metal is formed on the gate insulation layer 112 corresponding to the center of the semiconductor layer 121. The gate electrode 122 can be formed of at least one of aluminum (Al), copper (Cu), molybdenum (Mo), titanium (Ti), chromium (Cr), nickel (Ni), tungsten (W), platinum (Pt), palladium (Pd), silver (Ag), magnesium (Mg), gold (Au), neodymium (Nd), iridium (Ir), lithium (Li), calcium (Ca) or an alloy thereof and can have a single-layered structure or a multi-layered structure. For example, the gate electrode 122 can be formed of molybdenum or a molybdenum alloy.

Meanwhile, in the embodiment of the present disclosure, the gate insulation layer 112 is formed substantially over the entire surface of the substrate 110. However, the gate insulation layer 112 can be patterned to have substantially the same shape as the gate electrode 122.

A first interlayer insulation layer 113 and a second interlayer insulation layer 114 of an insulating material are formed on the gate electrode 122 substantially over the entire surface of the substrate 110. The first and second interlayer insulation layers 113 and 114 are third and fourth inorganic layers, respectively, and can be formed of an inorganic insulating material such as silicon oxide ($SiO_2$) or silicon nitride (SiNx). However, the present disclosure is not limited thereto. As another example, a single interlayer insulation layer made of an inorganic insulating material such as silicon oxide ($SiO_2$) or silicon nitride (SiNx) can be formed on the gate electrode 122.

The first interlayer insulation layer 113 and the second interlayer insulation layer 114 have contact holes exposing top surfaces of both ends of the semiconductor layer 121. The contact holes are also formed in the gate insulation layer 112. Alternatively, in some embodiments, when the gate insulation layer 112 is patterned to have substantially the same shape as the gate electrode 122, the contact holes are formed only in the first interlayer insulation layer 113 and the second interlayer insulation layer 114.

In addition, a gate line (not shown) and a first capacitor electrode (not shown) can be formed between the first interlayer insulation layer 113 and the second interlayer insulation layer 114. The gate line can extend in a first direction and be connected to the gate driving part GD of FIG. 1, and the first capacitor electrode can be connected to the gate electrode 122.

Alternatively, the gate line and the first capacitor electrode can be formed between the gate insulation layer 112 and the first interlayer insulation layer 113. Otherwise, one of the gate line and the first capacitor electrode can be formed between the first interlayer insulation layer 113 and the second interlayer insulation layer 114 and the other can be formed between the gate insulation layer 112 and the first interlayer insulation layer 113.

Source and drain electrodes 123 and 124 of a conductive material such as metal are formed on the second interlayer insulation layer 114. The source and drain electrodes 123 and 124 are spaced apart from each other with the gate electrode 122 positioned therebetween and are in contact with both ends of the semiconductor layer 121 through the contact holes formed in the first and second interlayer insulation layers 113 and 114, respectively.

The source and drain electrodes 123 and 124 can be formed of at least one of aluminum (Al), copper (Cu), molybdenum (Mo), titanium (Ti), chromium (Cr), nickel (Ni), tungsten (W), platinum (Pt), palladium (Pd), silver (Ag), magnesium (Mg), gold (Au), neodymium (Nd), iridium (Ir), lithium (Li), calcium (Ca) or an alloy thereof and can have a single-layered structure or a multi-layered structure. For example, the source and drain electrodes 123 and 124 can be formed of aluminum or an aluminum alloy and can have a triple-layered structure of titanium/aluminum/titanium.

The semiconductor layer 121, the gate electrode 122, and the source and drain electrodes 123 and 124 form the thin film transistor 120. The thin film transistor 120 has a coplanar structure in which the gate electrode 122 and the source and drain electrodes 123 and 124 are located at the same side with respect to the semiconductor layer 121.

Alternatively, the thin film transistor 120 can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. The semiconductor layer can be formed of oxide semiconductor or amorphous silicon.

The thin film transistor 120 corresponds to a driving thin film transistor, and although not shown in the figure, a switching thin film transistor having substantially the same structure as the driving thin film transistor 120 can be further formed in each pixel P. The gate electrode 122 of the driving thin film transistor 120 can be connected to a drain electrode (not shown) of the switching thin film transistor, and the source electrode 123 of the driving thin film transistor 120 can be connected to a power supply line (not shown). In addition, a gate electrode (not shown) and a source electrode (not shown) of the switching thin film transistor can be connected to the gate line and a data line, respectively.

In addition, one or more sensing thin film transistors having substantially the same structure as the driving thin film transistor 120 can be further formed in each pixel P, but the present disclosure is not limited thereto.

A passivation layer 115 of an insulating material is formed on the source and drain electrodes 123 and 124 substantially over the entire surface of the substrate 110. The passivation layer 115 is a fifth inorganic layer and can be formed of an inorganic insulating material such as silicon oxide ($SiO_2$) or silicon nitride (SiNx).

A first planarization layer 116 of an insulating material is formed on the passivation layer 115 substantially over the entire surface of the substrate 110. The first planarization layer 116 can have a flat top surface. The first planarization layer 116 is a first organic layer and can be formed of an organic insulating material such as photo acryl or benzocyclobutene. Alternatively, the first planarization layer 116 can be formed of one or more of acrylic resin, epoxy resin, phenol resin, polyamide resin, polyimide resin, unsaturated polyester resin, polyphenylene resin, or polyphenylene sulfide resin, but is not limited thereto.

The first planarization layer 116 has a first drain contact hole 116a partially exposing the drain electrode 124. The first drain contact hole 116a is also formed in the passivation layer 115 under the first planarization layer 116.

An auxiliary drain electrode 126 of a conductive material such as metal is formed on the first planarization layer 116. The auxiliary drain electrode 126 contacts the drain electrode 124 through the first drain contact hole 116a.

The auxiliary drain electrode 126 can be formed of at least one of aluminum (Al), copper (Cu), molybdenum (Mo), titanium (Ti), chromium (Cr), nickel (Ni), tungsten (W), platinum (Pt), palladium (Pd), silver (Ag), magnesium (Mg), gold (Au), neodymium (Nd), iridium (Ir), lithium (Li), calcium (Ca) or an alloy thereof and can have a single-layered structure or a multi-layered structure. For example, the auxiliary drain electrode 126 can be formed of aluminum or an aluminum alloy.

The auxiliary drain electrode 126 is illustrated as a separate component from the thin film transistor 120, but the present disclosure is not limited thereto. Alternatively, the thin film transistor 120 can further include the auxiliary drain electrode 126.

Meanwhile, a data line (not shown), a power supply line (not shown) and a second capacitor electrode (not shown) can be formed on the first planarization layer 116. Although not shown in the figure, the data line extends in a second direction and crosses the gate line to define each pixel region. The power supply line for providing a high level voltage is spaced apart from the data line. The second capacitor electrode is connected to the drain electrode 124 and overlaps the first capacitor electrode to form a storage capacitor with the insulation layers interposed therebetween as a dielectric. Alternatively, the first capacitor electrode can be connected to the drain electrode 124, and the second capacitor electrode can be connected to the gate electrode 122. However, the present disclosure is not limited thereto.

The data line, the power supply line and the second capacitor electrode can be formed on the same layer as the source and drain electrodes 123 and 124, that is, can be formed between the second interlayer insulation layer 114 and the passivation layer 115. Alternatively, at least one of the data line, the power supply line and the second capacitor electrode can be formed between the second interlayer insulation layer 114 and the passivation layer 115, and the others can be formed on the same layer as the auxiliary drain electrode 126, that is, on the first planarization layer 116.

A second planarization layer 117 of an insulating material is formed on the auxiliary drain electrode 126 substantially over the entire surface of the substrate 110. The second planarization layer 117 can have a flat top surface. The second planarization layer 117 is a second organic layer and can be formed of an organic insulating material such as photo acryl or benzocyclobutene. Alternatively, the first planarization layer 116 can be formed of one or more of acrylic resin, epoxy resin, phenol resin, polyamide resin, polyimide resin, unsaturated polyester resin, polyphenylene resin, or polyphenylene sulfide resin, but is not limited thereto. Here, the first and second planarization layers 116 and 117 can be formed of the same material or different materials.

The second planarization layer 117 has a second drain contact hole 117a partially exposing the auxiliary drain electrode 126. The second drain contact hole 117a is formed right over and overlaps the first drain contact hole 116a. Alternatively, the second drain contact hole 117a can be spaced apart from the first drain contact hole 116a.

The first electrode 131 is formed on the second planarization layer 117 and formed of a conductive material having a relatively high work function. The first electrode 131 is disposed in each pixel P and is in contact with the auxiliary drain electrode 126 through the second drain contact hole 117a. Accordingly, the first electrode 131 is electrically connected to the drain electrode 124 through the auxiliary drain electrode 126. For example, the first electrode 131 can be formed of a transparent conductive material such as indium tin oxide (ITO) or indium zinc oxide (IZO), but is not limited thereto.

Meanwhile, the electroluminescent display device according to the embodiment of the present disclosure can be a top emission type in which light of the light-emitting diode 130 is output toward a direction opposite the substrate 110. Accordingly, the first electrode 131 can further include a reflective electrode or a reflective layer formed of a metal material having a relatively high reflectance below the transparent conductive material. For example, the reflective electrode or reflective layer can be formed of an aluminum-palladium-copper (APC) alloy, silver (Ag) or aluminum (Al). The first electrode 131 can have a triple-layered structure of ITO/APC/ITO, ITO/Ag/ITO or ITO/Al/ITO, but is not limited thereto.

A bank 118 of an insulating material is formed on the first electrode 131. The bank 118 overlaps and covers edges of the first electrode 131 and exposes a central portion of the first electrode 131. The first electrode 131 exposed by the bank 118 can be defined as an emission area.

The bank 118 is a third organic layer can be formed of an organic insulating material such as polyimide or hexamethyldisiloxane (HIVIDSO). Alternatively, the bank 118 can be formed of acrylic resin or benzocyclobutene, but is not limited thereto.

Here, the second drain contact hole 117a can be disposed right under the bank 118. Alternatively, the second drain contact hole 117a can be spaced apart from the bank 118.

A spacer 119 of an insulating material is formed on the bank 118. The spacer 119 has a narrower width than the bank 118, and boundaries of the spacer 119 are disposed on the bank 118. Therefore, a top surface of the bank 118 is partially exposed by the spacer 119. In addition, a thickness of the spacer 119 can be thicker than a thickness of the bank 118. Alternatively, the thickness of the spacer 119 can be equal to the thickness of the bank 118.

The spacer 119 prevents a fine metal mask (FMM) used for forming the light-emitting layer 132 from directly contacting the bank 118 or the first electrode 131, thereby preventing damage of the light-emitting diode 130.

The spacer 119 can be formed of the same material as the bank 118. In some embodiments, the space 119 can be formed as one body with the bank 118. Alternatively, the spacer 119 can be formed of a different material from the bank 118. The spacer 119 can be formed through the same process as or a different process from the bank 118.

Next, the light-emitting layer 132 is formed on the first electrode 131 exposed by the bank 118.

Although not shown in the figure, the light-emitting layer 132 can include a first charge auxiliary layer, a light-emitting material layer, and a second charge auxiliary layer that are sequentially positioned over the first electrode 131. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

The light-emitting layer 132 can be formed through a thermal evaporation process using the fine metal mask.

Alternatively, the light-emitting layer 132 can be formed through a solution process. In this case, at least the top surface of the bank 118 can have a hydrophobic property, and the spacer 119 can be omitted. However, the present disclosure is not limited thereto.

The second electrode 133 of a conductive material having a relatively low work function is formed on the light-emitting layer 132 substantially over the entire surface of the substrate 110. The second electrode 133 is also formed on top and side surfaces of the bank 118 and the spacer 119.

The second electrode 133 can be formed of aluminum (Al), magnesium (Mg), silver (Ag), or an alloy thereof. The second electrode 133 has a relatively thin thickness such that light from the light-emitting layer 132 can be transmitted therethrough. Alternatively, the second electrode 133 can be formed of a transparent conductive material such as indium-gallium-oxide (IGO), but is not limited thereto.

The first electrode 131, the light-emitting layer 132 and the second electrode 133 constitute the light-emitting diode 130. The first electrode 131 can serve as an anode, and the second electrode 133 can serve as a cathode, but is not limited thereto.

As described above, the electroluminescent display device according to the embodiment of the present disclosure can be a top emission type in which light from the light-emitting layer 132 of the light-emitting diode 130 is output toward a direction opposite the substrate 110, that is, output to the outside through the second electrode 133. The top emission type display device can have a wider emission area than a bottom emission type display device of the same size, to thereby improve luminance and reduce power consumption.

The light-emitting diode 130 of each pixel P can have an element thickness for a micro-cavity effect corresponding to a wavelength of the emitted light, thereby increasing the light efficiency. Here, the element thickness can be defined as a distance between the first electrode 131 and the second electrode 133, but is not limited thereto.

In addition, an encapsulation part 135 is formed on the second electrode 133 substantially over the entire surface of the substrate 110. The encapsulation part 135 covers the light-emitting diode 130 and protects the light-emitting diode 130 by blocking the moisture or oxygen introduced from the outside. The encapsulation part 135 can have a stack structure in which an inorganic layer and an organic layer are alternately stacked.

For example, the encapsulation part 135 can include a first encapsulation layer 135a, a second encapsulation layer 135b and a third encapsulation layer 135c sequentially stacked on the light-emitting diode 130. Here, the first and third encapsulation layers 135a and 135c are sixth and seventh inorganic layers, respectively, and can be formed of an inorganic insulating material such as silicon oxide ($SiO_2$), silicon nitride (SiNx) or aluminum oxide ($Al_2O_3$). Further, the second encapsulation layer 135b is a fourth organic layer and can be formed of an organic insulating material such as acrylic resin or epoxy resin.

The touch sensor part 140 is formed on the encapsulation part 135 substantially over the entire surface of the substrate 110. The touch sensor part 140 includes a first touch insulation layer 141, a first conductive pattern 142, a second touch insulation layer 143, a second conductive pattern 144, and a third touch insulation layer 145 sequentially formed on the encapsulation part 135.

More particularly, the first touch insulation layer 141 of an insulating material is formed on the third encapsulation layer 135c of the encapsulation part 135 substantially over the entire surface of the substrate 110. The first touch insulation layer 141 is a touch buffer layer and can be an inorganic layer formed of an inorganic insulating material such as silicon oxide ($SiO_2$) or silicon nitride (SiNx).

A plurality of first conductive patterns 142, as a first electrode layer, is formed on the first touch insulation layer 141. The first conductive patterns 142 can be the bridge for connecting different patterns.

The first conductive patterns 142 can be formed of a conductive material such as metal and can have a single-layered structure or a multiple-layered structure. For example, the first conductive patterns 142 can have a triple-layered structure including first, second and third layers. In some embodiments, the first and third layers can be formed of the same material, and the second layer can be formed of a different material from the first and third layers. The material of the second layer can have lower resistivity than the material of the first and third layers. For example, the second layer can be formed of aluminum or aluminum alloy, and the first and third layers can be formed of titanium or titanium alloy. In addition, a thickness of the second layer can be thicker than a thickness of each of the first and third layers and can also be thicker than the sum of the thicknesses of the first and third layers. The thicknesses of the first and third layers can be substantially the same. However, the present disclosure is not limited thereto.

The second touch insulation layer 143 of an insulating material is formed on the first conductive patterns 142 substantially over the entire surface of the substrate 110. The second touch insulation layer 143 is a touch interlayer insulation layer and can be an inorganic layer formed of an inorganic insulating material such as silicon oxide ($SiO_2$) or silicon nitride (SiNx).

Here, the second touch insulation layer 143 has a contact hole exposing each first conductive pattern 142.

A plurality of second conductive patterns 144, as a second electrode layer, is formed on the second touch insulation layer 143. The second conductive patterns 144 can be the sensor electrode and can include a transmitting electrode Tx receiving a touch driving voltage from a touch driving part (not shown) of the outside and a receiving electrode Rx transmitting a touch sensing voltage to the touch driving part.

The second conductive patterns 144 can be formed of a conductive material such as metal and can have a single-layered structure or a multiple-layered structure. For example, the second conductive patterns 144 can have a triple-layered structure including first, second and third layers. In some embodiments, the first and third layers can be formed of the same material, and the second layer can be formed of a different material from the first and third layers. The material of the second layer can have lower resistivity than the material of the first and third layers. For example, the second layer can be formed of aluminum or aluminum alloy, and the first and third layers can be formed of titanium or titanium alloy. In addition, a thickness of the second layer can be thicker than a thickness of each of the first and third layers and can also be thicker than the sum of the thicknesses of the first and third layers. The thicknesses of the first and third layers can be the same. However, the present disclosure is not limited thereto.

The second conducive patterns 144 formed of a metal material can have a mesh shape.

Alternatively, the second conductive patterns 144 can be formed of a transparent conductive material. The second conductive patterns 144 formed of a transparent conductive material can have a block shape. The second conductive patterns 144 of a block shape can have a wider width than the second conductive patterns 144 of a mesh shape.

Meanwhile, a part of the second conductive patterns 144 can overlap the first conductive pattern 142 and can contact the first conductive pattern 142 through the contact hole formed in the second touch insulation layer 143.

The third touch insulation layer 145 of an insulating material is formed on the second conductive patterns 144 substantially over the entire surface of the substrate 110. The third touch insulation layer 145 is a touch protective layer and can be an organic layer formed of an organic insulating material. For example, the third touch insulation layer 145 can be formed of photo acryl or benzocyclobutene, but is not limited thereto.

As described above, in the present disclosure, by forming the first and second crack stoppers in the non-display device, the cracks generated inside and/or outside the display device can be effectively prevented from being propagated. The configuration of the non-display area of the electroluminescent display device according to the embodiment of the present disclosure will be described in detail with reference to the drawings.

First Embodiment

Figure 3:
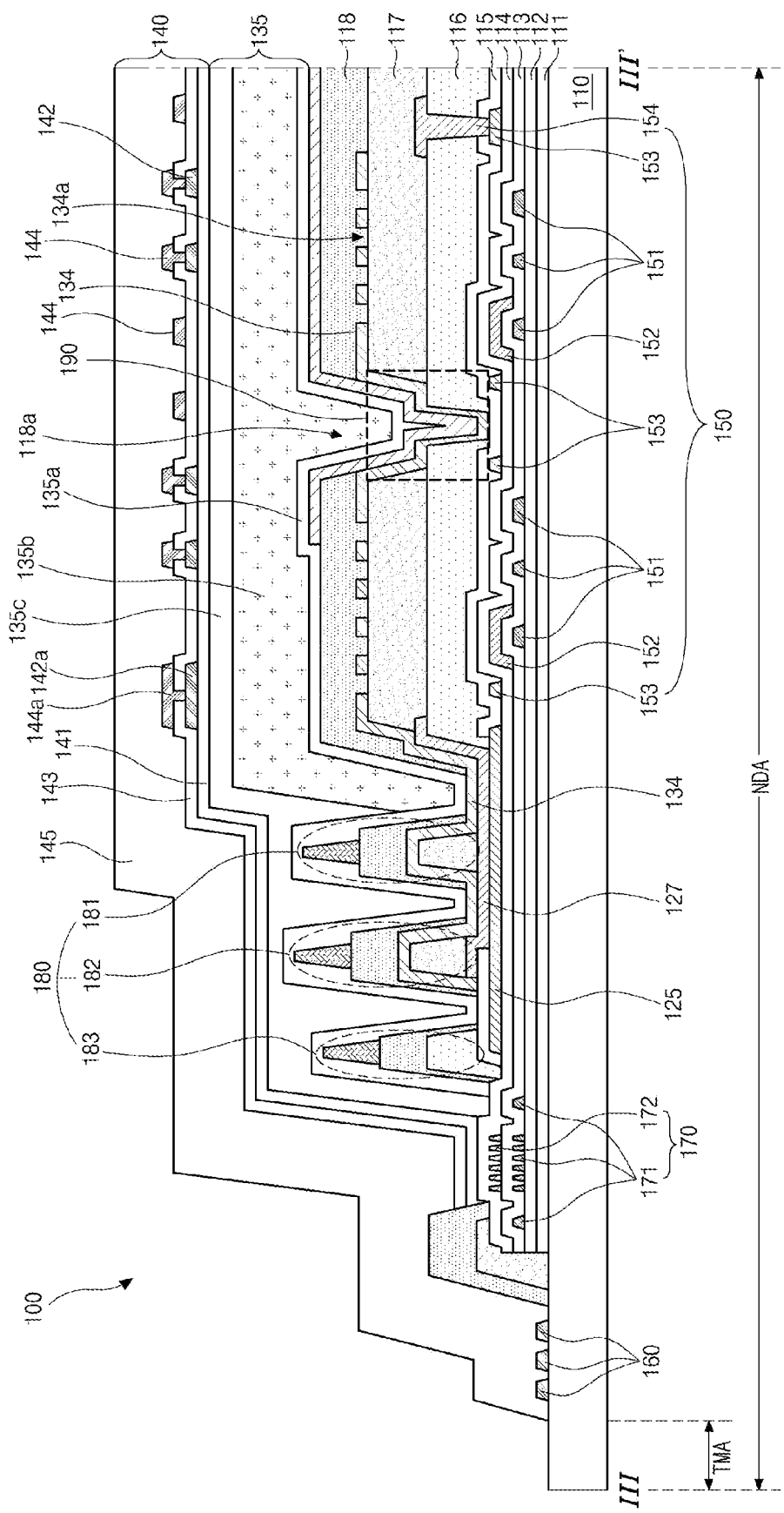
FIG. 3 is a cross-sectional view schematically illustrating a non-display area of an electroluminescent display device according to a first embodiment of the present disclosure.

FIG. 3 is a cross-sectional view schematically illustrating a non-display area of an electroluminescent display device according to a first embodiment of the present disclosure and shows a cross-section corresponding to the line III-III' of FIG. 1.

As shown in FIG. 3, the electroluminescent display device 100 according to the first embodiment of the present disclosure includes a gate driving part 150, a first crack stopper 160, a second crack stopper 170, a dam structure 180, and a moisture permeation prevention part 190 in a non-display area NDA. Here, the gate driving part 150 corresponds to the gate driving part GD of FIG. 1, the first crack stopper 160 corresponds to the first crack stopper CS1 of FIG. 1, and the second crack stopper 170 corresponds to the second crack stopper CS2 of FIG. 1.

As described above, the non-display area NDA includes the trimming margin area TMA at an edge thereof, and the gate driving part 150, the first crack stopper 160, the second crack stopper 170, the dam structure 180, and the moisture permeation prevention part 190 are disposed between the trimming margin area TMA and the display area DA of FIG. 1. No pattern is formed in the trimming margin area TMA, and thus, a top surface of the substrate 110 is exposed in the trimming margin area TMA.

Here, the first crack stopper 160 is disposed between the trimming margin area TMA and the second crack stopper 170, the gate driving part 150 is disposed between the dam structure 180 and the display area DA, and the dam structure 180 is disposed between the second crack stopper 170 and the gate driving part 150. In addition, the moisture permeation prevention part 190 can overlap the gate driving part 150.

More particularly, the gate driving part 150 includes first, second, third and fourth driving patterns 151, 152, 153 and 154, which are formed on different layers. The first driving pattern 151 can be formed through the same process as the gate electrode 122 of the display area DA of FIG. 2. In this case, the first driving pattern 151 is formed of the same material and on the same layer as the gate electrode 122 of FIG. 2. Accordingly, the first driving pattern 151 is disposed between the gate insulation layer 112 and the first interlayer insulation layer 113. The second driving pattern 152 can be formed through the same process as the gate line (not shown) of the display area DA of FIG. 2. The second driving pattern 152 is disposed between the first interlayer insulation layer 113 and the second interlayer insulation layer 114. The third driving pattern 153 can be formed through the same process as the source and drain electrodes 123 and 124 of the display area DA of FIG. 2. In this case, the third driving pattern 153 is formed of the same material and on the same layer as the source and drain electrodes 123 and 124 of FIG. 2. Accordingly, the third driving pattern 153 is disposed between the second interlayer insulation layer 114 and the passivation layer 115. The fourth driving pattern 154 can be formed through the same process as the auxiliary drain electrode 126 of the display area DA of FIG. 2. In this case, the fourth driving pattern 154 is formed of the same material and on the same layer as the auxiliary drain electrode 126 of FIG. 2. Accordingly, the fourth driving pattern 154 is disposed between the first planarization layer 116 and the second planarization layer 117.

Here, the first planarization layer 116 and the passivation layer 115 can have a contact hole exposing at least one third driving pattern 153, and the fourth driving pattern 154 can be in contact with the at least one third driving pattern 153 through the contact hole.

The first, second, third and fourth driving patterns 151, 152, 153 and 153 overlap or are spaced apart from each other and are electrically connected to each other, thereby forming switching elements and/or signal lines. The signal lines provide a scan signal, a clock signal CLK or a power source voltage.

However, the gate driving part 150 is not limited to the illustrated configuration, and the number, size and arrangement of the first, second, third and fourth driving patterns 151, 152, 153 and 154 can be changed.

Next, a low voltage supply line 125 is formed between the gate driving part 150 and the second crack stopper 170. The low voltage supply line 125 can be formed through the same process as the source and drain electrodes 123 and 124 of the display area DA of FIG. 2. Accordingly, the low voltage supply line 125 is formed of the same material and on the same layer as the source and drain electrodes 123 and 124 of FIG. 2 and is disposed between the second interlayer insulation layer 114 and the passivation layer 115. The low voltage supply line 125 is electrically connected to the second electrode 133 of the light-emitting diode 130 of FIG. 2 through a first connection pattern 127 and a second connection pattern 134.

In some embodiments, the second electrode 133 extends over the gate driving part 150 and contacts the second connection pattern 134 through a contact hole 118a formed in the bank 118.

A first end of the second connection pattern 134 is disposed between the second electrode 133 and the gate driving part 150 and overlaps the second electrode 133 and the gate driving part 150. In addition, a second end of the second connection pattern 134 overlaps the low voltage supply line 125. That is, the second connection pattern 134 overlaps the second electrode 133 and the low voltage supply line 125. The second electrode 133 does not overlap the low voltage supply line 125 and can be spaced apart from the low voltage supply line 125.

The second connection pattern 134 can be formed through the same process as the first electrode 131 of the display area DA. Accordingly, the second connection pattern 134 is formed of the same material and on the same layer as the first electrode 131 and is disposed between the second planarization layer 117 and the bank 118.

Here, the second connection pattern 134 has a plurality of holes 134a over the second planarization layer 117, and a top surface of the second planarization layer 117 is exposed through the holes 134a. The holes 134a can overlap the gate driving part 150.

The holes 134a serve as paths for out-gassing the moisture inside the first planarization layer 116 and the second planarization layer 117, which are the organic layers. The holes 134a each can have a rectangular shape or a circular shape, but is not limited thereto.

Meanwhile, the second connection pattern 134 can be in contact with the first connection pattern 127 through a contact hole formed substantially in the second planarization layer 117.

The first connection pattern 127 is disposed between the second crack stopper 170 and the gate driving part 150. In addition, the first connection pattern 127 is disposed between the low voltage supply line 125 and the second connection pattern 134 and overlaps the low voltage supply line 125 and the second connection pattern 134.

The first connection patter 127 can be formed through the same process as the auxiliary drain electrode 126 of the display area DA of FIG. 2. Accordingly, the first connection pattern 127 is formed of the same material and on the same layer as the auxiliary drain electrode 126 of FIG. 2, and at least a part of the first connection pattern 127 is disposed between the first planarization layer 116 and the second planarization layer 117. In addition, a part of the first connection pattern 127 can be disposed between the passivation layer 115 and the second planarization layer 117.

The first connection pattern 127 is in contact with the low voltage supply line 125 through a contact hole formed substantially in the first planarization layer 116 and the passivation layer 115. Accordingly, the second electrode 133 is electrically connected to the low voltage supply line 125 through the first and second connection patterns 127 and 134 and receives a low potential voltage. Here, the first connection pattern 127 can be omitted.

Meanwhile, as described above, the moisture permeation prevention part 190 can overlap the gate driving part 150. The moisture permeation prevention part 190 includes openings formed in the first and second planarization layers 116 and 117, which are the organic layers, respectively. In some embodiments, the moisture permeation prevention part 190 can be formed to surround at least three sides of the display area DA, that is, the left side, the right side and the lower side of the display area DA of FIG. 1. The moisture permeation prevention part 190 cuts off the organic layers that absorb the moisture well, thereby preventing the moisture from permeating the display area DA.

The moisture permeation prevention part 190 can overlap the contact hole 118a formed in the bank 118.

Next, the second crack stopper 170 is disposed between the trimming margin area TMA and the low voltage supply line 125.

The second crack stopper 170 includes a plurality of first stop patterns 171 and a plurality of second stop patterns 172 formed of a conductive material such as metal. The first and second stop patterns 171 and 172 of the second crack stopper 170 can be formed through the same processes as the electrode layers of the thin film transistor 120 of the display area DA of FIG. 2.

For example, the first stop patterns 171 can be formed through the same process as the gate electrode 122 of FIG. 2. The first stop patterns 171 can be formed of the same material and on the same layer as the gate electrode 122 of FIG. 2 and can be disposed between the gate insulation layer 112 and the first interlayer insulation layer 113. In addition, the second stop patterns 172 can be formed through the same process as the gate line (not shown) of the display area DA of FIG. 2. The second stop patterns 172 can be formed of the same material and on the same layer as the gate line and can be disposed between the first interlayer insulation layer 113 and the second interlayer insulation layer 114.

Here, some of the first stop patterns 171 can function as detecting the crack. For example, both end patterns of the first stop patterns 171 can detect variation in resistance and check whether or not the crack is generated. However, the present disclosure is not limited thereto. Alternatively, some of the second stop patterns 171 can function as detecting the crack or separate crack detection patterns can be further formed. The crack detection patterns can be formed of the same material and on the same layer as the source and drain electrodes 123 and 124 of FIG. 2.

The first and second stop patterns 171 and 172 of the second crack stopper 170 are formed between the inorganic layers where the crack is easily generated, that is, the buffer layer 111, the gate insulation layer 112, the first interlayer insulation layer 113, the second interlayer insulation layer 114, and the passivation layer 115 and prevent the crack generated inside and/or outside the display device from being propagated through the inorganic layers 111, 112, 113, 114 and 115.

Meanwhile, if the edges of the inorganic layers 111, 112, 113, 114 and 115 are exposed, the crack is easily generated. Accordingly, it is preferable that the edges of the inorganic layers 111, 112, 113, 114 and 115 are covered by an organic layer. In some embodiments, the edges of some of the inorganic layers 111, 112, 113, 114 and 115 can coincide with each other and be disposed on the same line, but is not limited thereto.

For example, the edges of the buffer layer 111, the gate insulation layer 112, the first interlayer insulation layer 113 and the second interlayer insulation layer 114 can be covered by the second planarization layer 117 of the organic layer and can coincide with each other and be disposed on the same line. Accordingly, side surfaces of the buffer layer 111, the gate insulation layer 112, the first interlayer insulation layer 113 and the second interlayer insulation layer 114 can contact the second planarization layer 117.

Next, the dam structure 180 is formed between the second crack stopper 170 and the gate driving part 150. In some embodiments, the dam structure 180 can overlap the low voltage supply line 125.

The dam structure 180 is formed to surround the four sides of the display area DA and controls flow of the organic layer of the encapsulation part 135, that is, the second encapsulation layer 135b.

The dam structure 180 can be provided in plurality, and each component of the dam structure 180 can be formed by stacking one or more layers. For example, the dam structure 180 includes first, second and third dams 181, 182 and 183. Here, each of the first and second dams 181 and 182 can be configured by stacking the patterns that are formed through the same processes as the second planarization layer 117, the bank 118 and the spacer 119 of FIG. 2, and the third dam 183 can be configured by stacking the patterns that are formed through the same processes as the first planarization layer 116, the bank 118 and the spacer 119 of FIG. 2.

The dam structure 180 minimizes the height difference between top surfaces of the dam structure 180 and the second encapsulation layer 135b, so that the organic material of the second encapsulation layer 135b can be prevented from overflowing.

The number and stacked structure of the dam structure 180 are not limited to the illustrated configuration and can be varied.

The encapsulation part 135 is formed on the second electrode 133 and the dam structure 180. As described above, the encapsulation part 135 includes the first, second and third encapsulation layers 135a, 135b and 135c. The first and third encapsulation layers 135a and 135c are formed of inorganic insulating materials, and the second encapsulation layer 135b is formed of an organic insulating material.

Here, the first and third encapsulation layers 135a and 135c of the inorganic layers are formed to cover the dam structure 180, and the second encapsulation layer 135b of the organic layer is spaced apart from the dam structure 180 such that the edge of the second encapsulation layer 135b is disposed between the dam structure 180 and the display area DA. Accordingly, the first and third encapsulation layers 135a and 135c are in contact with each other over the dam structure 180, and the second encapsulation layer 135b is at least partially surrounded by the first and third encapsulation layers 135a and 135c. In some embodiments, the third encapsulation layer 135c contacts the side surface of the second encapsulation layer 135b.

In addition, the edges of the first and third encapsulation layers 135a and 135c can be disposed substantially between the second crack stopper 170 and the dam structure 180, and the first and third encapsulation layers 135a and 135c can expose the inorganic layer on the second crack stopper 170, that is, the second interlayer insulation layer 114.

Next, the touch sensor part 140 is disposed on the encapsulation part 135. As described above, the touch sensor part 140 includes the first touch insulation layer 141, the first conductive patterns 142, the second touch insulation layer 143, the second conductive patterns 144, and the third touch insulation layer 145. The first and second conductive patterns 142 and 144 can overlap the gate driving part 150.

In addition, the touch sensor part 140 can include touch ground lines 142a and 144a at an end thereof. The touch ground lines 142a and 144a include a first ground pattern 142a and a second ground pattern 144a. The first ground pattern 142a is formed through the same process as the first conductive patterns 142. The first ground pattern 142a is formed of the same material and on the same layer as the first conductive patterns 142 and is disposed between the first touch insulation layer 141 and the second touch insulation layer 143. Further, the second ground pattern 144a is formed through the same process as the second conductive patterns 144. The second ground pattern 144a is formed of the same material and on the same layer as the second conductive patterns 144 and is disposed between the second touch insulation layer 143 and the third touch insulation layer 145.

The second ground pattern 144a contacts the first ground pattern 142a through a contact hole formed in the second touch insulation layer 143.

Meanwhile, the first, second and third touch insulation layers 141, 143 and 145 cover the dam structure 180 and the encapsulation part 135. In addition, the first, second and third touch insulation layers 141, 143 and 145 cover the second crack stopper 170. In some embodiments, the first touch insulation layer 141 is in contact with the top and side surfaces of the third encapsulation layer 135c and is in contact with the top surface of the second interlayer insulation layer 114 on the second crack stopper 170.

The edges of the first and second touch insulation layers 141 and 143 can be disposed substantially on the same line and can be covered by an organic layer. In some embodiments, the side surfaces of the first and second touch insulation layers 141 and 143 can contact the bank 118.

Further, the third touch insulation layer 145 is formed substantially all over the non-display area NDA excluding the trimming margin area TMA and covers the second crack stopper 170, the dam structure 180 and the gate driving part 150.

Next, the first crack stopper 160 is formed between the trimming margin area TMA and the second crack stopper 170. The first crack stopper 160 contacts the substrate 110, and the first crack stopper 160 is covered by and is in contact with the third touch insulation layer 145 of the organic layer. That is, the first crack stopper 160 is disposed between the substrate 110 and the third touch insulation layer 145. No inorganic layer is formed over and under the first crack stopper 160. Accordingly, the first crack stopper 160 is spaced apart from the inorganic layers and is not in contact with any inorganic layer.

The first crack stopper 160 can include a plurality of stop patterns formed of a conductive material. For example, the first crack stopper 160 can include three stop patterns. However, the present disclosure is not limited thereto, but the number of stop patterns can be changed.

Alternatively, the first crack stopper 160 can include only one stop pattern, and in other embodiments, the first crack stopper 160 can include a hole therein.

The first crack stopper 160 can be formed through the same process as the first electrode layer of the touch sensor part 140. That is, the first crack stopper 160 can be formed through the same process as the first conductive patterns 142. Accordingly, the first crack stopper 160 can be formed of the same material as the first conductive patterns 142 and can be formed of a metal material.

Alternatively, the first crack stopper 160 can be formed through the same process as the second electrode layer of the touch sensor part 140. That is, the first crack stopper 160 can be formed through the same process as the second conductive patterns 144. Accordingly, the first crack stopper 160 can be formed of the same material as the second conductive patterns 142 and can be formed of a metal material or a transparent conductive material.

As described above, in the electroluminescent display device 100 according to the first embodiment of the present disclosure, the inorganic layer is not exposed to the outside, so that the occurrence of the crack can be suppressed.

In addition, the first and second crack stoppers 160 and 170 are provided in the non-display area NDA, and even if the crack is generated due to the impacts outside the display device or the stresses inside the display device, the propagation of the crack inside the display device can be effectively prevented by the first and second crack stoppers 160 and 170. Accordingly, the moisture can be prevented from permeating through the crack, thereby protecting the light-emitting layer 132 of FIG. 2 and increasing the reliability of the light-emitting diode 130 of FIG. 2.

Since the first crack stopper 160 is formed through the same process as the electrode layer of the touch sensor part 140 and the second crack stopper 170 is formed through the same process as the electrode layer of the thin film transistor 120 of FIG. 2, the first and second crack stoppers 160 and 170 can be formed without an additional process.

Further, the first crack stopper 160 is spaced apart from the inorganic layer, the occurrence and propagation of the crack can be further prevented.

Moreover, the first crack stopper 160 is formed adjacent to the trimming margin area TMA, so that the restriction on the design margin can be reduced and the narrow bezel can be implemented.

Second Embodiment

Figure 4:
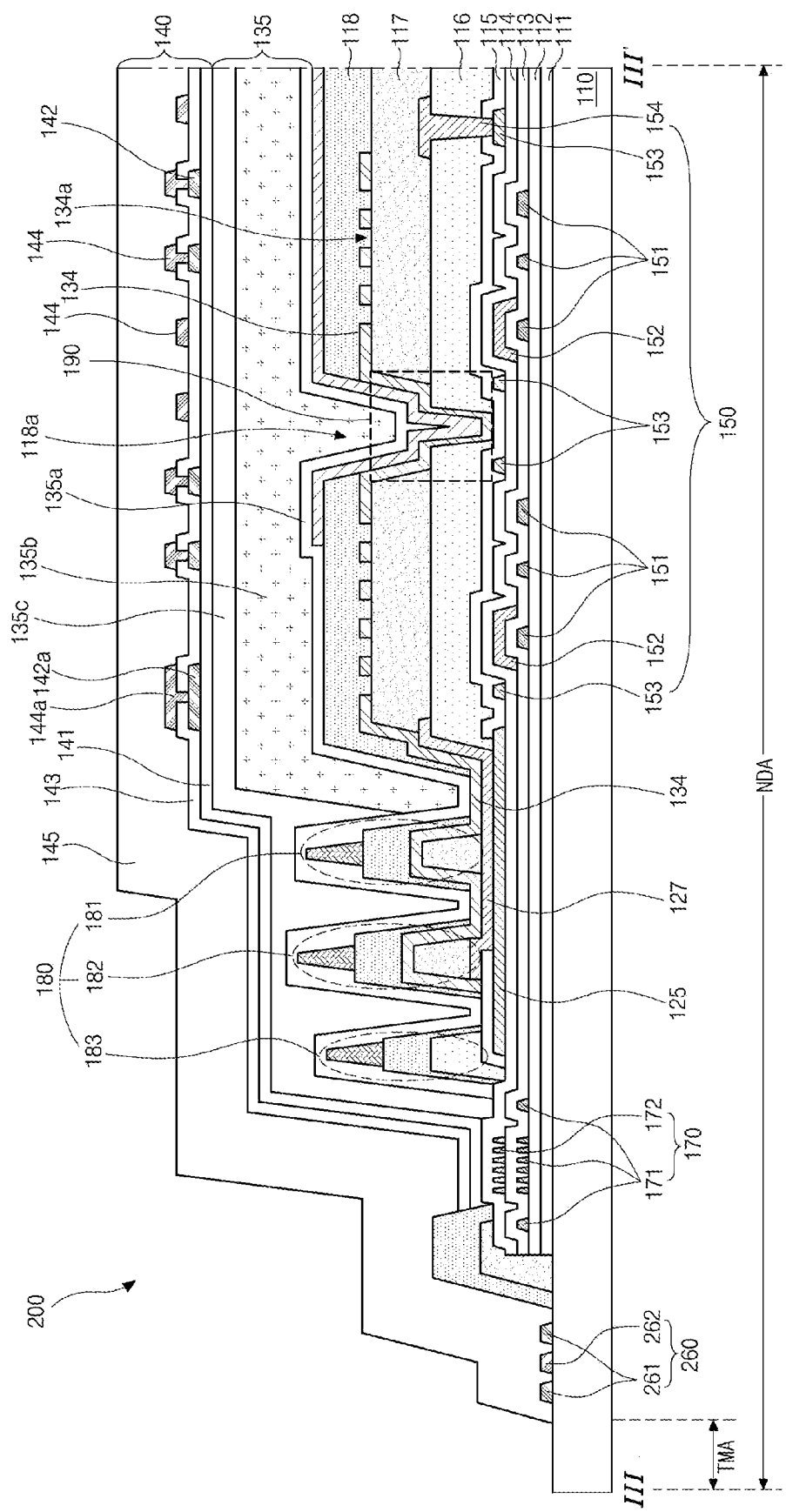
FIG. 4 is a cross-sectional view schematically illustrating a non-display area of an electroluminescent display device according to a second embodiment of the present disclosure.

FIG. 4 is a cross-sectional view schematically illustrating a non-display area of an electroluminescent display device according to a second embodiment of the present disclosure and shows a cross-section corresponding to the line III-III' of FIG. 1. The electroluminescent display device according to the second embodiment of the present disclosure has substantially the same configuration as the first embodiment except for the first crack stopper. The same parts as those of the first embodiment are designated by the same reference signs, and explanation for the same parts will be shortened or omitted.

As shown in FIG. 4, the electroluminescent display device 200 according to the second embodiment of the present disclosure includes the gate driving part 150, the first crack stopper 260, the second crack stopper 170, the dam structure 180, and the moisture permeation prevention part 190 in the non-display area NDA.

The gate driving part 150, the first crack stopper 260, the second crack stopper 170, the dam structure 180, and the moisture permeation prevention part 190 are disposed between the trimming margin area TMA and the display area DA of FIG. 1. No pattern is formed in the trimming margin area TMA, and thus, the top surface of the substrate 110 is exposed in the trimming margin area TMA.

Here, the first crack stopper 260 is disposed between the trimming margin area TMA and the second crack stopper 170, the gate driving part 150 is disposed between the dam structure 180 and the display area DA, and the dam structure 180 is disposed between the second crack stopper 170 and the gate driving part 150. In addition, the moisture permeation prevention part 190 can overlap the gate driving part 150.

The first crack stopper 260 contacts the substrate 110, and the first crack stopper 260 is covered by and is in contact with the third touch insulation layer 145 of the organic layer. That is, the first crack stopper 260 is disposed between the substrate 110 and the third touch insulation layer 145. No inorganic layer is formed over and under the first crack stopper 260. Accordingly, the first crack stopper 260 is spaced apart from the inorganic layers and is not in contact with any inorganic layer.

The first crack stopper 260 can include a plurality of stop patterns formed of a conductive material. For example, the first crack stopper 260 can include at least one first pattern 261 and at least one second pattern 262. That is, the first crack stopper 260 can include the first pattern 261 and the second pattern 262 which are alternately arranged. For example, the first crack stopper 260 can include two first patterns 261 and one second pattern 262. However, the present disclosure is not limited thereto, but the number of first and second patterns 261 and 262 can be changed.

Here, the first patterns 261 can be formed through the same process as the first electrode layer of the touch sensor part 140. That is, the first patterns 261 can be formed through the same process as the first conductive patterns 142. Accordingly, the first patterns 261 can be formed of the same material as the first conductive patterns 142 and can be formed of a metal material.

In addition, the second pattern 262 can be formed through the same process as the second electrode layer of the touch sensor part 140. That is, the second pattern 262 can be formed through the same process as the second conductive patterns 144. Accordingly, the second pattern 262 can be formed of the same material as the second conductive patterns 142 and can be formed of a metal material or a transparent conductive material.

The first and second patterns 261 and 262 can be formed of different materials.

As described above, in the electroluminescent display device 200 according to the second embodiment of the present disclosure, the first and second crack stoppers 260 and 170 are provided in the non-display area NDA, and even if the crack is generated due to the impacts outside the display device or the stresses inside the display device, the propagation of the crack inside the display device can be effectively prevented by the first and second crack stoppers 260 and 170. Accordingly, the moisture can be prevented from permeating through the crack, thereby protecting the light-emitting layer 132 of FIG. 2 and increasing the reliability of the light-emitting diode 130 of FIG. 2.

Since the first crack stopper 260 is formed through the same process as the electrode layer of the touch sensor part 140 and the second crack stopper 170 is formed through the same process as the electrode layer of the thin film transistor 120 of FIG. 2, the first and second crack stoppers 260 and 170 can be formed without an additional process.

Further, the first crack stopper 260 is formed by alternately arranging the first and second patterns 261 and 262 formed of different materials, the propagation of the crack can be further effectively prevented.

Third Embodiment

Figure 5:
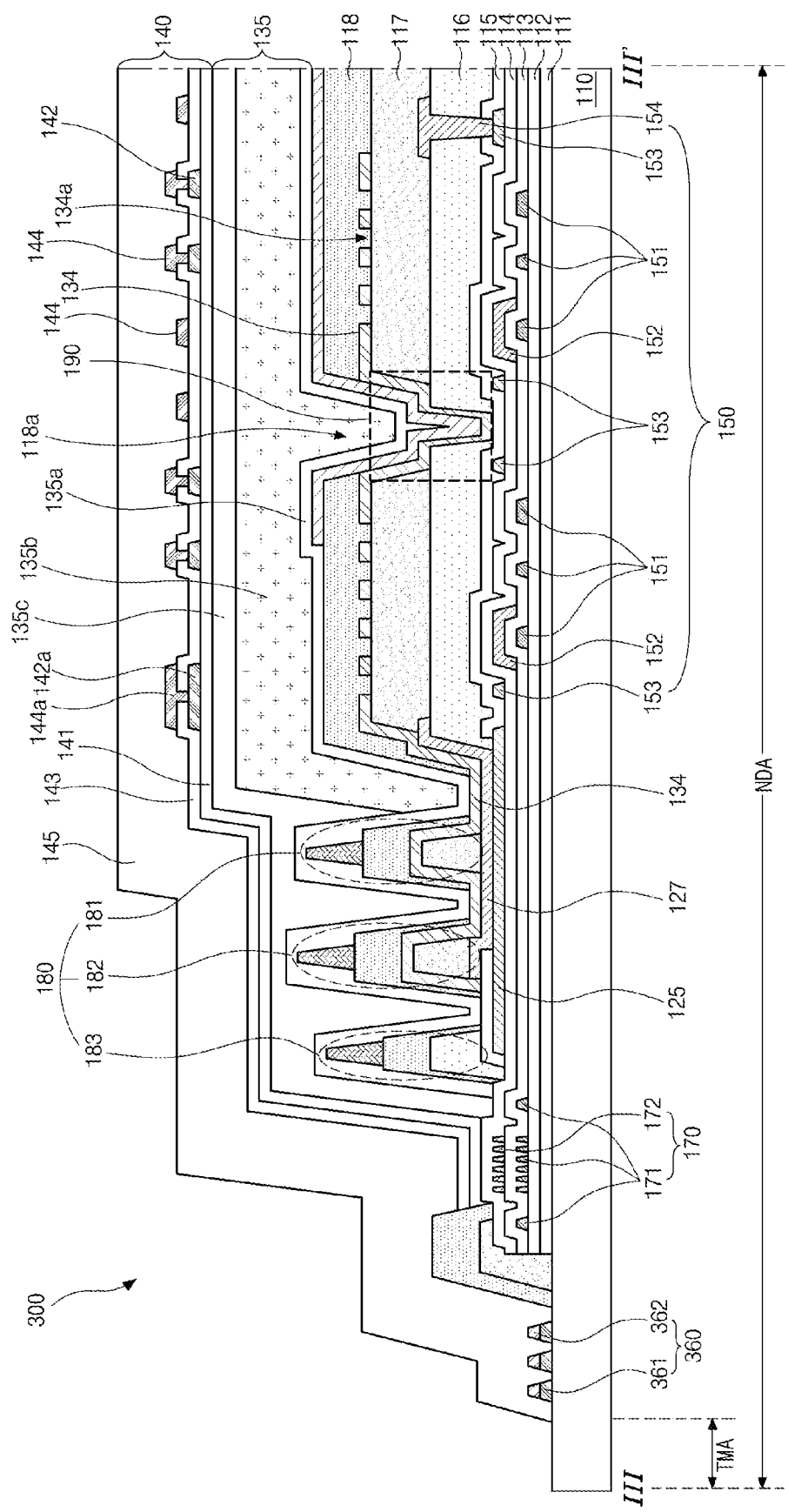
FIG. 5 is a cross-sectional view schematically illustrating a non-display area of an electroluminescent display device according to a third embodiment of the present disclosure.

FIG. 5 is a cross-sectional view schematically illustrating a non-display area of an electroluminescent display device according to a third embodiment of the present disclosure and shows a cross-section corresponding to the line III-III' of FIG. 1. The electroluminescent display device according to the third embodiment of the present disclosure has substantially the same configuration as the first embodiment except for the first crack stopper. The same parts as those of the first embodiment are designated by the same reference signs, and explanation for the same parts will be shortened or omitted.

As shown in FIG. 5, the electroluminescent display device 300 according to the third embodiment of the present disclosure includes the gate driving part 150, the first crack stopper 360, the second crack stopper 170, the dam structure 180, and the moisture permeation prevention part 190 in the non-display area NDA.

The gate driving part 150, the first crack stopper 360, the second crack stopper 170, the dam structure 180, and the moisture permeation prevention part 190 are disposed between the trimming margin area TMA and the display area DA of FIG. 1. No pattern is formed in the trimming margin area TMA, and thus, the top surface of the substrate 110 is exposed in the trimming margin area TMA.

Here, the first crack stopper 360 is disposed between the trimming margin area TMA and the second crack stopper 170, the gate driving part 150 is disposed between the dam structure 180 and the display area DA, and the dam structure 180 is disposed between the second crack stopper 170 and the gate driving part 150. In addition, the moisture permeation prevention part 190 can overlap the gate driving part 150.

The first crack stopper 360 contacts the substrate 110, and the first crack stopper 360 is covered by and is in contact with the third touch insulation layer 145 of the organic layer. That is, the first crack stopper 360 is disposed between the substrate 110 and the third touch insulation layer 145. No inorganic layer is formed over and under the first crack stopper 360. Accordingly, the first crack stopper 360 is spaced apart from the inorganic layers and is not in contact with any inorganic layer.

The first crack stopper 360 can include a plurality of stop patterns formed of a conductive material. In some embodiments, each stop pattern can have a first pattern 361 and a second pattern 362 on the first pattern 361. That is, the first crack stopper 360 can have a double-layered structure of the first pattern 361 and the second pattern 362 stacked. For example, the first crack stopper 360 can include three stop patterns. However, the present disclosure is not limited thereto, but the number of stop patterns can be changed.

Alternatively, the first crack stopper 360 can include only one stop pattern having the double-layered structure, and in other embodiments, the first crack stopper 360 can include a hole therein.

Here, the first patterns 361 can be formed through the same process as the first electrode layer of the touch sensor part 140. That is, the first patterns 361 can be formed through the same process as the first conductive patterns 142. Accordingly, the first patterns 361 can be formed of the same material as the first conductive patterns 142 and can be formed of a metal material.

In addition, the second patterns 362 can be formed through the same process as the second electrode layer of the touch sensor part 140. That is, the second patterns 362 can be formed through the same process as the second conductive patterns 144. Accordingly, the second patterns 362 can be formed of the same material as the second conductive patterns 142 and can be formed of a metal material or a transparent conductive material.

The first and second patterns 361 and 362 can be formed of different materials.

As described above, in the electroluminescent display device 300 according to the third embodiment of the present disclosure, the first and second crack stoppers 360 and 170 are provided in the non-display area NDA, and even if the crack is generated due to the impacts outside the display device or the stresses inside the display device, the propagation of the crack inside the display device can be effectively prevented by the first and second crack stoppers 360 and 170. Accordingly, the moisture can be prevented from permeating through the crack, thereby protecting the light-emitting layer 132 of FIG. 2 and increasing the reliability of the light-emitting diode 130 of FIG. 2.

Since the first crack stopper 360 is formed through the same process as the electrode layer of the touch sensor part 140 and the second crack stopper 170 is formed through the same process as the electrode layer of the thin film transistor 120 of FIG. 2, the first and second crack stoppers 360 and 170 can be formed without an additional process.

Further, the first crack stopper 360 is formed to have the structure where the first and second patterns 361 and 362 of different materials are stacked, so that the propagation of the crack can be further effectively prevented.

Fourth Embodiment

Figure 6:
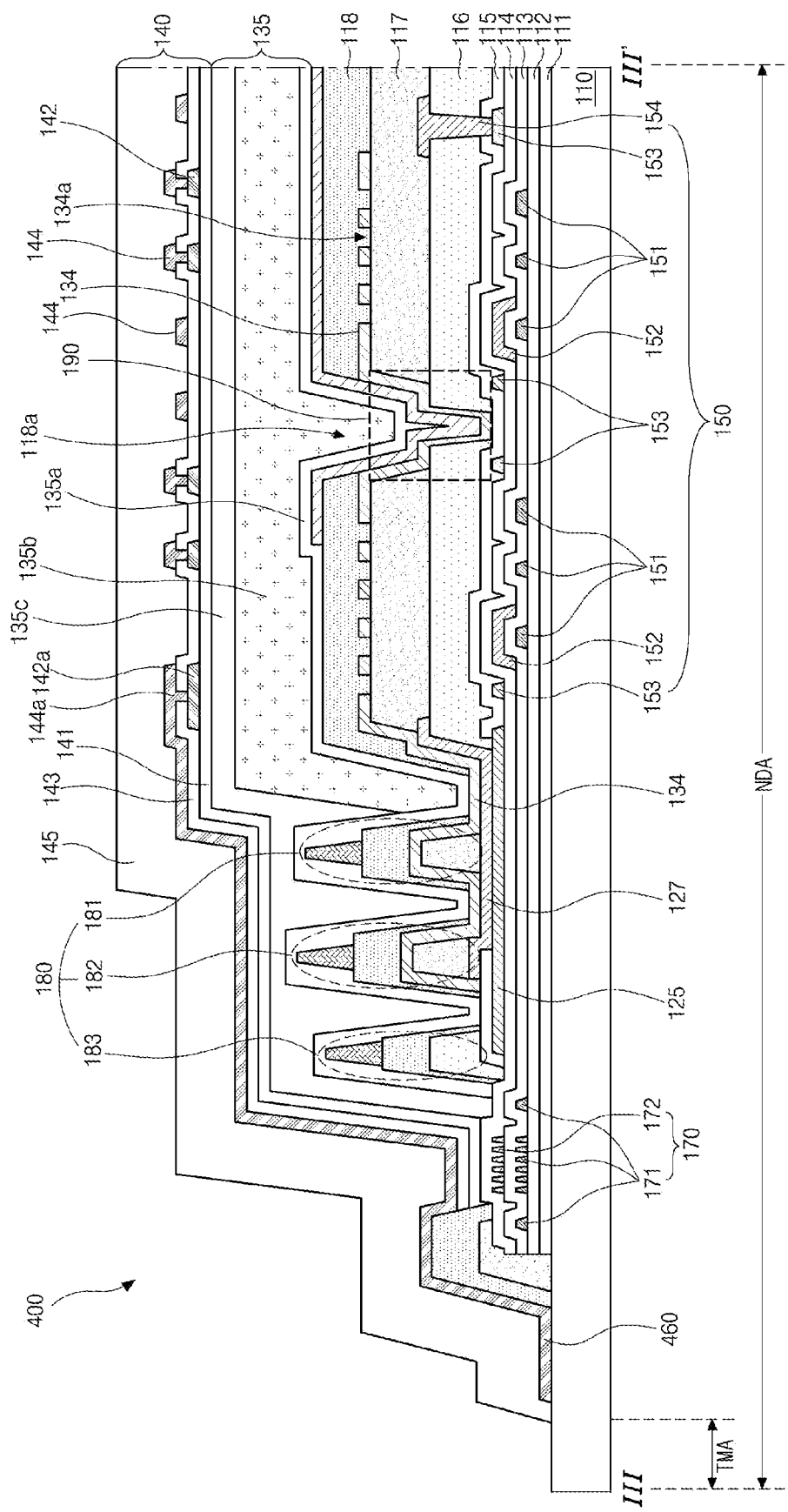
FIG. 6 is a cross-sectional view schematically illustrating a non-display area of an electroluminescent display device according to a fourth embodiment of the present disclosure.

FIG. 6 is a cross-sectional view schematically illustrating a non-display area of an electroluminescent display device according to a fourth embodiment of the present disclosure and shows a cross-section corresponding to the line III-III' of FIG. 1. The electroluminescent display device according to the fourth embodiment of the present disclosure has substantially the same configuration as the first embodiment except for the first crack stopper. The same parts as those of the first embodiment are designated by the same reference signs, and explanation for the same parts will be shortened or omitted.

As shown in FIG. 6, the electroluminescent display device 400 according to the fourth embodiment of the present disclosure includes the gate driving part 150, the first crack stopper 460, the second crack stopper 170, the dam structure 180, and the moisture permeation prevention part 190 in the non-display area NDA.

The gate driving part 150, the first crack stopper 460, the second crack stopper 170, the dam structure 180, and the moisture permeation prevention part 190 are disposed between the trimming margin area TMA and the display area DA of FIG. 1. No pattern is formed in the trimming margin area TMA, and thus, the top surface of the substrate 110 is exposed in the trimming margin area TMA.

Here, the first crack stopper 460 is disposed between the trimming margin area TMA and the second crack stopper 170, the gate driving part 150 is disposed between the dam structure 180 and the display area DA, and the dam structure 180 is disposed between the second crack stopper 170 and the gate driving part 150. In addition, the moisture permeation prevention part 190 can overlap the gate driving part 150.

The first crack stopper 460 contacts the substrate 110, and the first crack stopper 460 is covered by and is in contact with the third touch insulation layer 145 of the organic layer. That is, the first crack stopper 460 is disposed between the substrate 110 and the third touch insulation layer 145. No inorganic layer is formed over and under the first crack stopper 460. Accordingly, the first crack stopper 460 is spaced apart from the inorganic layers and is not in contact with any inorganic layer.

The first crack stopper 460 can include one stop pattern formed of a conductive material. In some embodiments, the first crack stopper 460 can have a hole (not shown) therein.

The first crack stopper 460 can be formed through the same process as the second electrode layer of the touch sensor part 140. That is, the first crack stopper 460 can be formed through the same process as the second conductive patterns 144. Accordingly, the first crack stopper 460 can be formed of the same material as the second conductive patterns 144 and can be formed of a metal material or a transparent conductive material.

In addition, the first crack stopper 460 can be connected to the touch ground lines 142a and 144a. More particularly, the first crack stopper 460 can be connected to the second ground pattern 144a to thereby form one body.

Alternatively, the first crack stopper 460 can include a plurality of stop patterns, and at least one stop pattern can be connected to the second ground pattern 144a.

As described above, in the electroluminescent display device 400 according to the fourth embodiment of the present disclosure, the first and second crack stoppers 460 and 170 are provided in the non-display area NDA, and even if the crack is generated due to the impacts outside the display device or the stresses inside the display device, the propagation of the crack inside the display device can be effectively prevented by the first and second crack stoppers 460 and 170. Accordingly, the moisture can be prevented from permeating through the crack, thereby protecting the light-emitting layer 132 of FIG. 2 and increasing the reliability of the light-emitting diode 130 of FIG. 2.

Since the first crack stopper 460 is formed through the same process as the electrode layer of the touch sensor part 140 and the second crack stopper 170 is formed through the same process as the electrode layer of the thin film transistor 120 of FIG. 2, the first and second crack stoppers 460 and 170 can be formed without an additional process.

Further, the first crack stopper 460 is connected to the touch ground lines 142a and 144a, so that the resistance of the touch ground lines 142a and 144a can be decreased, and the charges introduced from the outside can be rapidly discharged, thereby improving the greenish defect of the screen.

Fifth Embodiment

Figure 7:
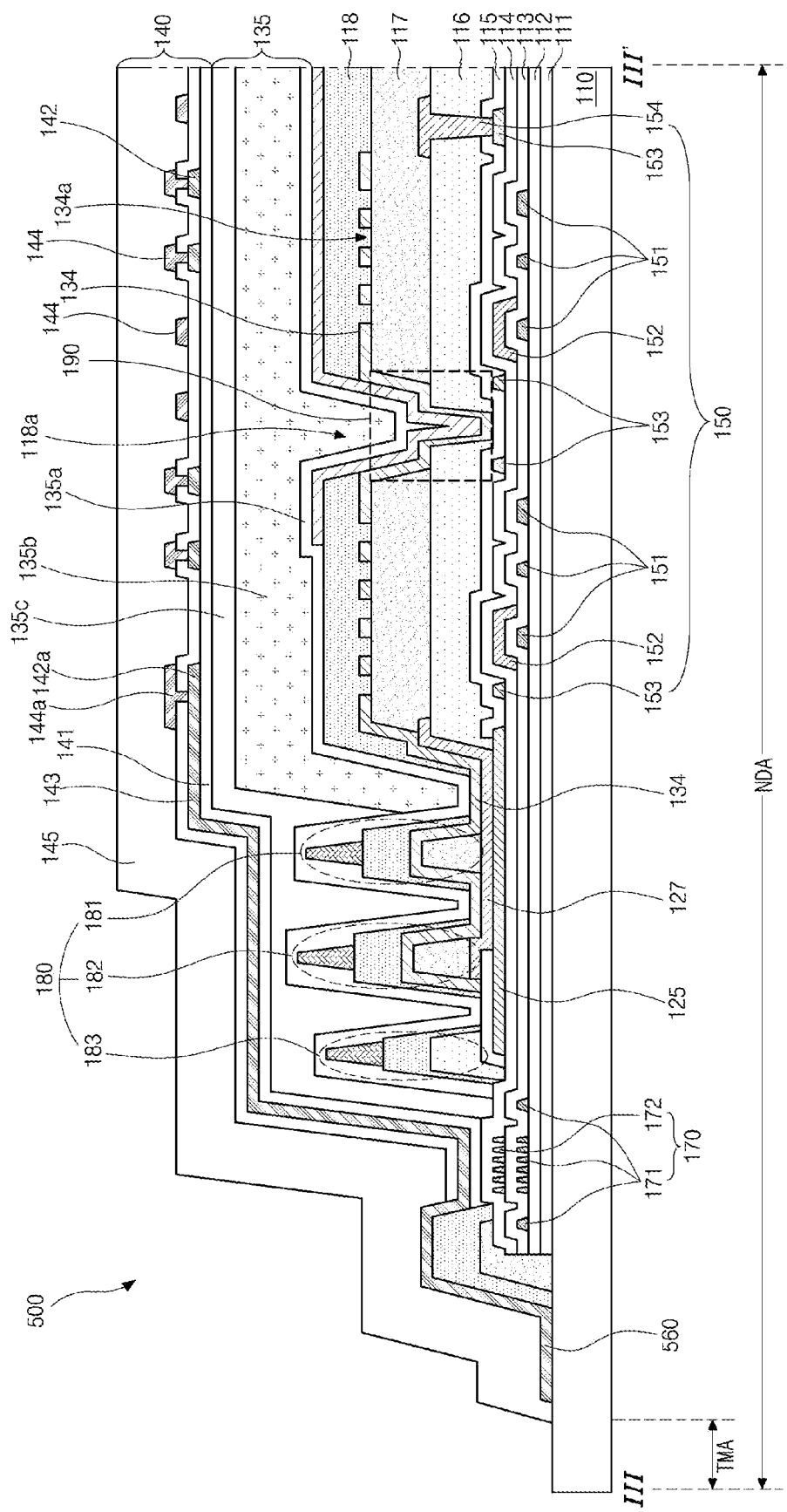
FIG. 7 is a cross-sectional view schematically illustrating a non-display area of an electroluminescent display device according to a fifth embodiment of the present disclosure.

FIG. 7 is a cross-sectional view schematically illustrating a non-display area of an electroluminescent display device according to a fifth embodiment of the present disclosure and shows a cross-section corresponding to the line III-III' of FIG. 1. The electroluminescent display device according to the fifth embodiment of the present disclosure has substantially the same configuration as the first embodiment except for the first crack stopper. The same parts as those of the first embodiment are designated by the same reference signs, and explanation for the same parts will be shortened or omitted.

As shown in FIG. 7, the electroluminescent display device 500 according to the fifth embodiment of the present disclosure includes the gate driving part 150, the first crack stopper 560, the second crack stopper 170, the dam structure 180, and the moisture permeation prevention part 190 in the non-display area NDA.

The gate driving part 150, the first crack stopper 560, the second crack stopper 170, the dam structure 180, and the moisture permeation prevention part 190 are disposed between the trimming margin area TMA and the display area DA of FIG. 1. No pattern is formed in the trimming margin area TMA, and thus, the top surface of the substrate 110 is exposed in the trimming margin area TMA.

Here, the first crack stopper 560 is disposed between the trimming margin area TMA and the second crack stopper 170, the gate driving part 150 is disposed between the dam structure 180 and the display area DA, and the dam structure 180 is disposed between the second crack stopper 170 and the gate driving part 150. In addition, the moisture permeation prevention part 190 can overlap the gate driving part 150.

The first crack stopper 560 contacts the substrate 110, and the first crack stopper 560 is covered by and is in contact with the third touch insulation layer 145 of the organic layer. That is, the first crack stopper 560 is disposed between the substrate 110 and the third touch insulation layer 145. No inorganic layer is formed over and under the first crack stopper 560. Accordingly, the first crack stopper 560 is spaced apart from the inorganic layers and is not in contact with any inorganic layer.

The first crack stopper 560 can include one stop pattern formed of a conductive material. In some embodiments, the first crack stopper 560 can have a hole (not shown) therein.

The first crack stopper 560 can be formed through the same process as the first electrode layer of the touch sensor part 140. That is, the first crack stopper 560 can be formed through the same process as the first conductive patterns 142. Accordingly, the first crack stopper 560 can be formed of the same material as the first conductive patterns 142 and can be formed of a metal material.

In addition, the first crack stopper 560 can be connected to the touch ground lines 142a and 144a. More particularly, the first crack stopper 560 can be connected to the first ground pattern 142a to thereby form one body.

Alternatively, the first crack stopper 560 can include a plurality of stop patterns, and at least one stop pattern can be connected to the first ground pattern 142a.

As described above, in the electroluminescent display device 500 according to the fifth embodiment of the present disclosure, the first and second crack stoppers 560 and 170 are provided in the non-display area NDA, and even if the crack is generated due to the impacts outside the display device or the stresses inside the display device, the propagation of the crack inside the display device can be effectively prevented by the first and second crack stoppers 560 and 170. Accordingly, the moisture can be prevented from permeating through the crack, thereby protecting the light-emitting layer 132 of FIG. 2 and increasing the reliability of the light-emitting diode 130 of FIG. 2.

Since the first crack stopper 560 is formed through the same process as the electrode layer of the touch sensor part 140 and the second crack stopper 170 is formed through the same process as the electrode layer of the thin film transistor 120 of FIG. 2, the first and second crack stoppers 560 and 170 can be formed without an additional process.

Further, the first crack stopper 560 is connected to the touch ground lines 142a and 144a, so that the resistance of the touch ground lines 142a and 144a can be decreased, and the charges introduced from the outside can be rapidly discharged, thereby improving the greenish defect of the screen.

Sixth Embodiment

Figure 8:
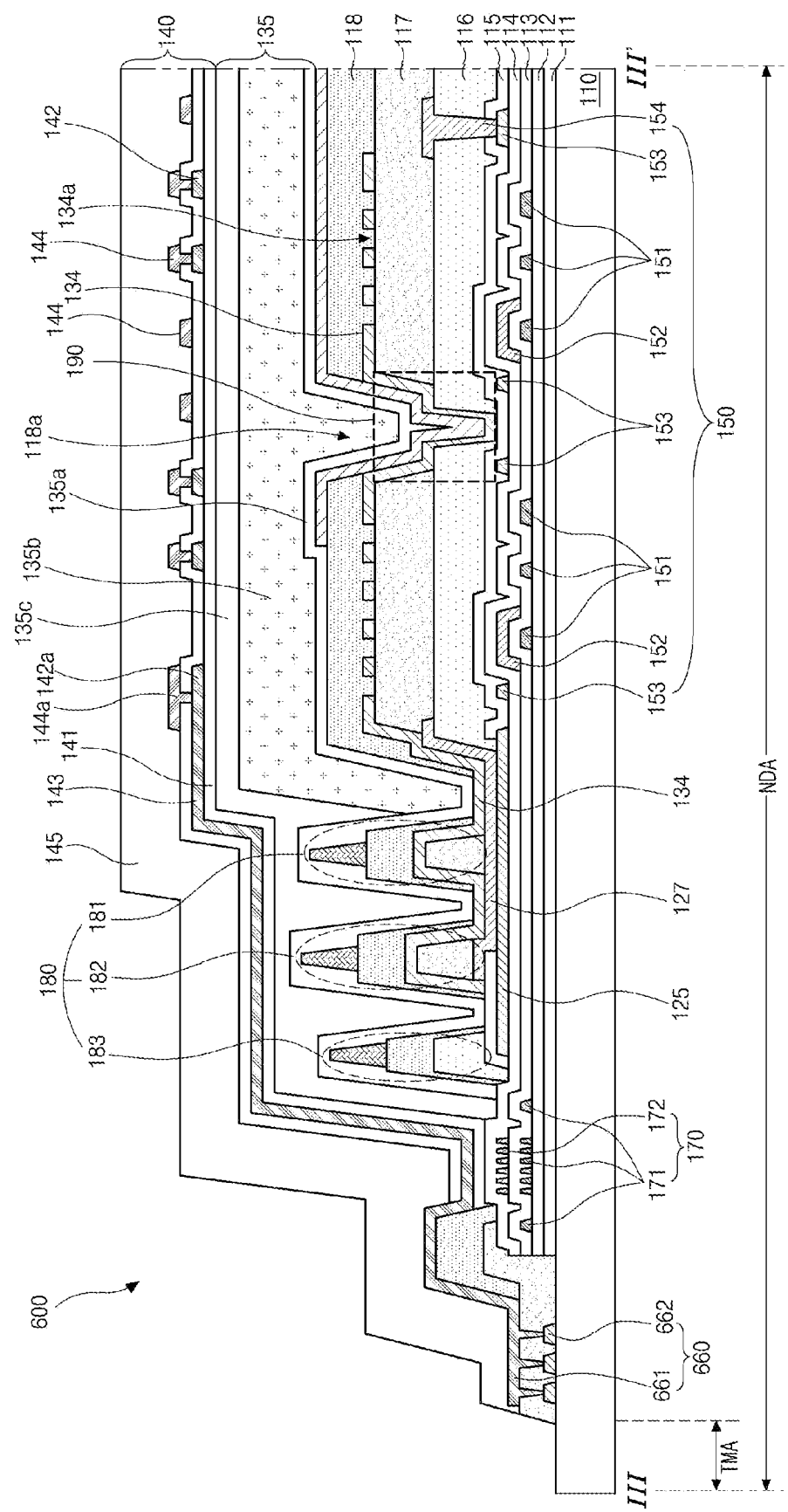
FIG. 8 is a cross-sectional view schematically illustrating a non-display area of an electroluminescent display device according to a sixth embodiment of the present disclosure.

FIG. 8 is a cross-sectional view schematically illustrating a non-display area of an electroluminescent display device according to a sixth embodiment of the present disclosure and shows a cross-section corresponding to the line III-III' of FIG. 1. The electroluminescent display device according to the sixth embodiment of the present disclosure has substantially the same configuration as the first embodiment except for the first crack stopper. The same parts as those of the first embodiment are designated by the same reference signs, and explanation for the same parts will be shortened or omitted.

As shown in FIG. 8, the electroluminescent display device 600 according to the sixth embodiment of the present disclosure includes the gate driving part 150, the first crack stopper 660, the second crack stopper 170, the dam structure 180, and the moisture permeation prevention part 190 in the non-display area NDA.

The gate driving part 150, the first crack stopper 660, the second crack stopper 170, the dam structure 180, and the moisture permeation prevention part 190 are disposed between the trimming margin area TMA and the display area DA of FIG. 1. No pattern is formed in the trimming margin area TMA, and thus, the top surface of the substrate 110 is exposed in the trimming margin area TMA.

Here, the first crack stopper 660 is disposed between the trimming margin area TMA and the second crack stopper 170, the gate driving part 150 is disposed between the dam structure 180 and the display area DA, and the dam structure 180 is disposed between the second crack stopper 170 and the gate driving part 150. In addition, the moisture permeation prevention part 190 can overlap the gate driving part 150.

The first crack stopper 660 contacts the substrate 110, and the first crack stopper 660 is covered by and is in contact with the third touch insulation layer 145 of the organic layer. That is, the first crack stopper 660 is disposed between the substrate 110 and the third touch insulation layer 145. No inorganic layer is formed over and under the first crack stopper 660. Accordingly, the first crack stopper 660 is spaced apart from the inorganic layers and is not in contact with any inorganic layer.

The first crack stopper 660 includes one first pattern 661 and a plurality of second patterns 662 which are formed of a conductive material. Here, the first pattern 661 is in contact with the third touch insulation layer 145, and the second patterns 662 are in contact with the substrate 110. The first pattern 661 can be formed through the same process as the electrode layer of the touch sensor part 140, and the second patterns 662 can be formed through the same process as the electrode layer of the thin film transistor 120 of FIG. 2.

For example, the first pattern 661 can be formed through the first electrode layer of the touch sensor part 140. That is, the first pattern 661 can be formed through the same process as the first conductive patterns 142. Accordingly, the first pattern 661 can be formed of the same material as the first conductive patterns 142 and can be formed of a metal material.

The first pattern 661 can be connected to the touch ground lines 142a and 144a. More particularly, the first pattern 661 can be connected to the first ground pattern 142a to thereby form one body.

In addition, the second patterns 662 can be formed through the same process as the source and drain electrodes 123 and 124 of the display area DA of FIG. 2. Accordingly, the second patterns 662 can be formed of the same material as the source and drain electrodes 123 and 124 of FIG. 2 and can be formed of a metal material.

However, the present disclosure is not limited thereto. For example, the second patterns 662 can be formed through the same process as the gate electrode 122 of the display area DA of FIG. 2. Alternatively, the second patterns 662 can be formed through the same process as the gate line (not shown) or the auxiliary drain electrode 126 of the display area DA of FIG. 2.

An organic layer can be formed between the first pattern 661 and the second patterns 662. That is, the second planarization layer 117 can be formed between the first pattern 661 and the second patterns 662, the second patterns 662 can be covered by the second planarization layer 117, and the first pattern 661 can be in contact with the second patterns 662 through respective contact holes formed in the second planarization layer 117.

As described above, in the electroluminescent display device 600 according to the sixth embodiment of the present disclosure, the first and second crack stoppers 660 and 170 are provided in the non-display area NDA, and even if the crack is generated due to the impacts outside the display device or the stresses inside the display device, the propagation of the crack inside the display device can be effectively prevented by the first and second crack stoppers 660 and 170. Accordingly, the moisture can be prevented from permeating through the crack, thereby protecting the light-emitting layer 132 of FIG. 2 and increasing the reliability of the light-emitting diode 130 of FIG. 2.

Since the first pattern 661 of the first crack stopper 660 is formed through the same process as the electrode layer of the touch sensor part 140 and the second patterns 662 of the first crack stopper 660 and the second crack stopper 170 are formed through the same process as the electrode layer of the thin film transistor 120 of FIG. 2, the first and second crack stoppers 660 and 170 can be formed without an additional process.

Further, the first crack stopper 660 is connected to the touch ground lines 142a and 144a, so that the resistance of the touch ground lines 142a and 144a can be decreased, and the charges introduced from the outside can be rapidly discharged, thereby improving the greenish defect of the screen.

Seventh Embodiment

Figure 9:
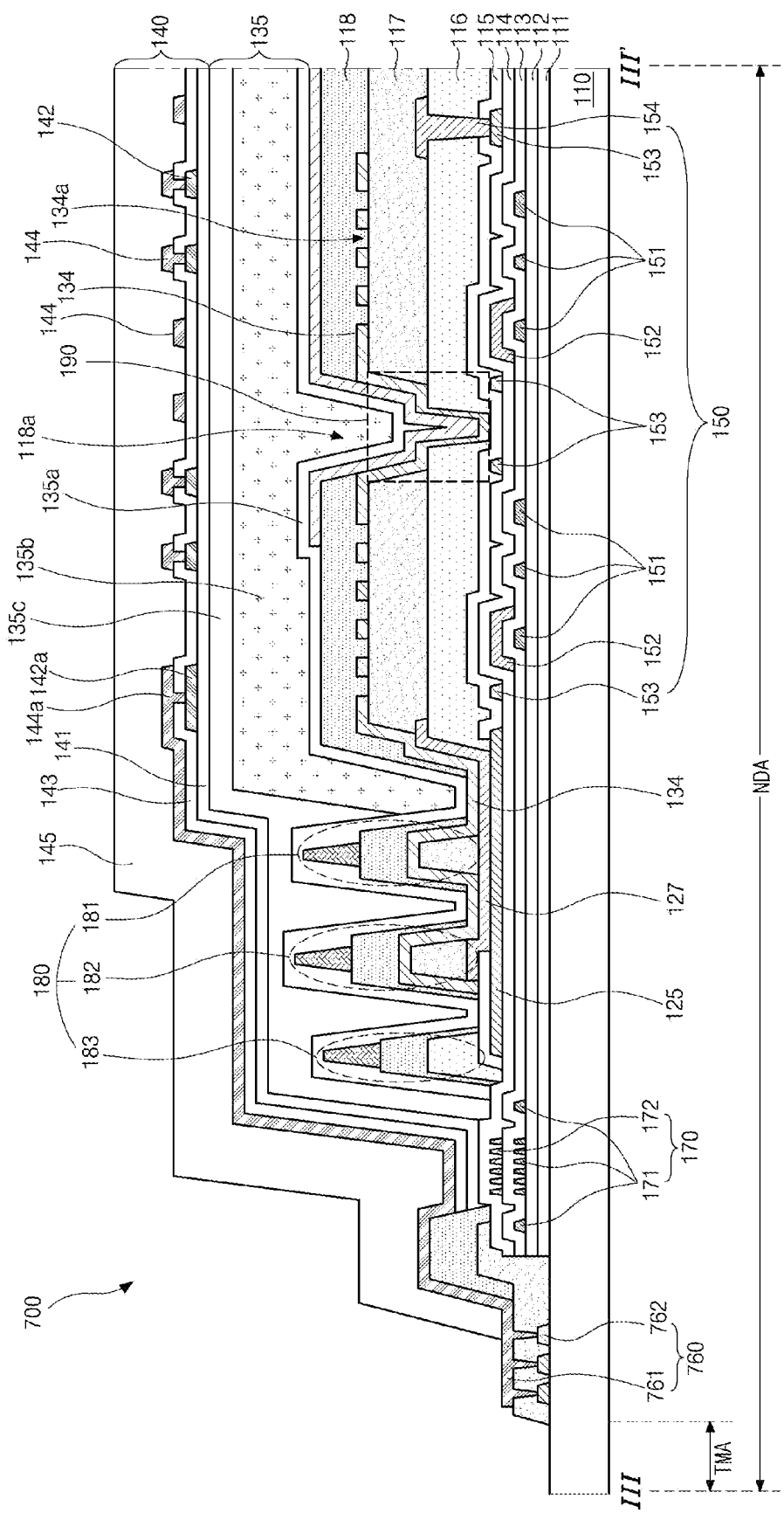
FIG. 9 is a cross-sectional view schematically illustrating a non-display area of an electroluminescent display device according to a seventh embodiment of the present disclosure.

FIG. 9 is a cross-sectional view schematically illustrating a non-display area of an electroluminescent display device according to a seventh embodiment of the present disclosure and shows a cross-section corresponding to the line III-III' of FIG. 1. The electroluminescent display device according to the seventh embodiment of the present disclosure has substantially the same configuration as the first embodiment except for the first crack stopper. The same parts as those of the first embodiment are designated by the same reference signs, and explanation for the same parts will be shortened or omitted.

As shown in FIG. 9, the electroluminescent display device 700 according to the seventh embodiment of the present disclosure includes the gate driving part 150, the first crack stopper 760, the second crack stopper 170, the dam structure 180, and the moisture permeation prevention part 190 in the non-display area NDA.

The gate driving part 150, the first crack stopper 760, the second crack stopper 170, the dam structure 180, and the moisture permeation prevention part 190 are disposed between the trimming margin area TMA and the display area DA of FIG. 1. No pattern is formed in the trimming margin area TMA, and thus, the top surface of the substrate 110 is exposed in the trimming margin area TMA.

Here, the first crack stopper 760 is disposed between the trimming margin area TMA and the second crack stopper 170, the gate driving part 150 is disposed between the dam structure 180 and the display area DA, and the dam structure 180 is disposed between the second crack stopper 170 and the gate driving part 150. In addition, the moisture permeation prevention part 190 can overlap the gate driving part 150.

The first crack stopper 760 contacts the substrate 110, and the first crack stopper 760 is covered by and is in contact with the third touch insulation layer 145 of the organic layer. That is, the first crack stopper 760 is disposed between the substrate 110 and the third touch insulation layer 145. No inorganic layer is formed over and under the first crack stopper 760. Accordingly, the first crack stopper 760 is spaced apart from the inorganic layers and is not in contact with any inorganic layer.

The first crack stopper 760 includes one first pattern 761 and a plurality of second patterns 762 which are formed of a conductive material. Here, the first pattern 761 is in contact with the third touch insulation layer 145 and is partially exposed, and the second patterns 762 are in contact with the substrate 110. The first pattern 761 can be formed through the same process as the electrode layer of the touch sensor part 140, and the second patterns 762 can be formed through the same process as the electrode layer of the thin film transistor 120 of FIG. 2.

For example, the first pattern 761 can be formed through the second electrode layer of the touch sensor part 140. That is, the first pattern 761 can be formed through the same process as the second conductive patterns 144. Accordingly, the first pattern 761 can be formed of the same material as the second conductive patterns 144 and can be formed of a metal material or a transparent conductive material.

The first pattern 761 can be connected to the touch ground lines 142a and 144a. More particularly, the first pattern 761 can be connected to the second ground pattern 144a to thereby form one body.

In addition, the second patterns 762 can be formed through the same process as the source and drain electrodes 123 and 124 of the display area DA of FIG. 2. Accordingly, the second patterns 762 can be formed of the same material as the source and drain electrodes 123 and 124 of FIG. 2 and can be formed of a metal material.

However, the present disclosure is not limited thereto. For example, the second patterns 762 can be formed through the same process as the gate electrode 122 of the display area DA of FIG. 2. Alternatively, the second patterns 762 can be formed through the same process as the gate line (not shown) or the auxiliary drain electrode 126 of the display area DA of FIG. 2.

An organic layer can be formed between the first pattern 761 and the second patterns 762. That is, the second planarization layer 117 can be formed between the first pattern 761 and the second patterns 762, the second patterns 762 can be covered by the second planarization layer 117, and the first pattern 761 can be in contact with the second patterns 762 through respective contact holes formed in the second planarization layer 117.

As described above, in the electroluminescent display device 700 according to the seventh embodiment of the present disclosure, the first and second crack stoppers 760 and 170 are provided in the non-display area NDA, and even if the crack is generated due to the impacts outside the display device or the stresses inside the display device, the propagation of the crack inside the display device can be effectively prevented by the first and second crack stoppers 760 and 170. Accordingly, the moisture can be prevented from permeating through the crack, thereby protecting the light-emitting layer 132 of FIG. 2 and increasing the reliability of the light-emitting diode 130 of FIG. 2.

Since the first pattern 761 of the first crack stopper 760 is formed through the same process as the electrode layer of the touch sensor part 140 and the second patterns 762 of the first crack stopper 760 and the second crack stopper 170 are formed through the same process as the electrode layer of the thin film transistor 120 of FIG. 2, the first and second crack stoppers 760 and 170 can be formed without an additional process.

Further, the first crack stopper 760 is connected to the touch ground lines 142a and 144a, so that the resistance of the touch ground lines 142a and 144a can be decreased, and the charges introduced from the outside can be rapidly discharged, thereby improving the greenish defect of the screen.

In the electroluminescent display device according to the embodiment, the inorganic layer is not exposed to the outside, so that the occurrence of the crack can be suppressed.

In addition, the crack stoppers are formed in the non-display area, and even if the crack is generated due to the impacts outside the display device or the stresses inside the display device, the propagation of the crack can be prevented. Accordingly, the moisture can be prevented from permeating through the crack, thereby protecting the light-emitting layer and increasing the reliability of the light-emitting diode.

In some embodiments, since the first crack stopper is formed through the same process as the electrode layer of the touch sensor part and the second crack stopper is formed through the same process as the electrode layer of the thin film transistor, the first and second cracks can be formed without an additional process.

Moreover, the first crack stopper is formed adjacent to the trimming margin area, so that the restriction on the design margin can be reduced and the narrow bezel can be implemented.

Further, the first crack stopper is connected to the touch ground lines, so that the resistance of the touch ground lines can be decreased, and the charges introduced from the outside can be rapidly discharged, thereby improving the greenish defect of the screen.

It will be apparent to those skilled in the art that various modifications and variations can be made in a device of the present disclosure without departing from the sprit or scope of the embodiments. Thus, it is intended that the present disclosure covers the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
   a substrate having thereon a display area and a non-display area adjacent to the display area;
   a thin film transistor and a light-emitting diode disposed in the display area on the substrate and electrically connected to each other;
   an encapsulation part at least partially covering the thin film transistor and the light-emitting diode;
   a touch sensor part on the encapsulation part, the touch sensor part including an electrode layer; and
   first and second crack stoppers disposed in the non-display area on the substrate,
   wherein the second crack stopper is disposed between the first crack stopper and the display area,
   wherein the first crack stopper includes a first pattern that is formed through a same process of a same material as an electrode layer of the touch sensor part, and
   wherein the first crack stopper is in contact with the substrate.

2. The electroluminescent display device of claim 1, wherein the electrode layer of the touch sensor part includes a first electrode layer and a second electrode layer, wherein the first crack stopper further includes a second pattern, and
   wherein the first pattern is formed through a same process as the first electrode layer of the touch sensor part, and the second pattern is formed through a same process as the second electrode layer of the touch sensor part.

3. The electroluminescent display device of claim 2, wherein the first pattern and the second pattern are alternately arranged.

4. The electroluminescent display device of claim 2, wherein the first crack stopper has a double-layered structure in which the first pattern and the second pattern are stacked.

5. The electroluminescent display device of claim 1, wherein the touch sensor part includes a touch ground line, and the first pattern is connected to the touch ground line.

6. The electroluminescent display device of claim 1, wherein the first crack stopper further includes a second pattern, and the second pattern is formed through a same process as an electrode layer of the thin film transistor.

7. The electroluminescent display device of claim 6, wherein the second pattern is in contact with the substrate.

8. The electroluminescent display device of claim 7, wherein an organic layer is disposed between the first pattern and the second pattern, and the first pattern is in contact with the second pattern through a contact hole formed in the organic layer.

9. The electroluminescent display device of claim 1, wherein the touch sensor part includes a touch protective layer at least partially covering the electrode layer, and the first crack stopper is in contact with the touch protective layer.

10. The electroluminescent display device of claim 1, wherein the first crack stopper is spaced apart from inorganic layers.

11. The electroluminescent display device of claim 1, wherein the thin film transistor includes an electrode layer, wherein the second crack stopper is formed through a same process as the electrode layer of the thin film transistor.

12. The electroluminescent display device of claim 1, wherein the non-display area includes a trimming margin area, and the first and second crack stoppers are disposed between the trimming margin area and the display area.

13. The electroluminescent display device of claim 12, wherein a top surface of the substrate is exposed in the trimming margin area.

14. The electroluminescent display device of claim 12, further comprising a moisture permeation prevention part between the second crack stopper and the display area, wherein the moisture permeation prevention part includes an opening formed in an organic layer.

15. The electroluminescent display device of claim 14, further comprising a gate driving part between the second crack stopper and the display area, wherein the moisture permeation prevention part overlaps the gate driving part.

16. The electroluminescent display device of claim 1, wherein the first pattern is formed of a metal material or a transparent conductive material.

17. An electroluminescent display device, comprising:
   a substrate having thereon a display area and a non-display area adjacent to the display area;
   a thin film transistor and a light-emitting diode disposed in the display area on the substrate and electrically connected to each other;
   an encapsulation part at least partially covering the thin film transistor and the light-emitting diode;
   a touch sensor part on the encapsulation part, the touch sensor part including an electrode layer; and
   first and second crack stoppers disposed in the non-display area on the substrate,
   wherein the second crack stopper is disposed between the first crack stopper and the display area,
   wherein the first crack stopper includes a first pattern that is formed through a same process as an electrode layer of the touch sensor part,
   wherein the first crack stopper is in contact with the substrate, and
   wherein the touch sensor part includes a touch ground line, and the first pattern is connected to the touch ground line.

18. An electroluminescent display device, comprising:
   a substrate having thereon a display area and a non-display area adjacent to the display area;
   a thin film transistor and a light-emitting diode disposed in the display area on the substrate and electrically connected to each other;
   an encapsulation part at least partially covering the thin film transistor and the light-emitting diode;
   a touch sensor part on the encapsulation part, the touch sensor part including an electrode layer; and
   first and second crack stoppers disposed in the non-display area on the substrate,
   wherein the second crack stopper is disposed between the first crack stopper and the display area,
   wherein the first crack stopper includes a first pattern that is formed through a same process as an electrode layer of the touch sensor part,
   wherein the first crack stopper is in contact with the substrate, and
   wherein the touch sensor part includes a touch protective layer at least partially covering the electrode layer, and the first crack stopper is in contact with the touch protective layer.

* * * * *